(12) United States Patent
Akiyama et al.

(10) Patent No.: US 7,556,860 B2
(45) Date of Patent: Jul. 7, 2009

(54) LAMINATE AND METHOD OF FORMING THE SAME, INSULATING FILM, AND SEMICONDUCTOR DEVICE

(75) Inventors: Masahiro Akiyama, Tsukuba (JP); Seitaro Hattori, Tsukuba (JP); Takahiko Kurosawa, Tsukuba (JP); Manabu Sekiguchi, Tsukuba (JP); Terukazu Kokubo, Tsukuba (JP); Michihiro Mita, Yokkaichi (JP); Tatsuya Yamanaka, Tsukuba (JP); Masaki Obi, Ageo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 11/410,895

(22) Filed: Apr. 26, 2006

(65) Prior Publication Data

US 2006/0216531 A1 Sep. 28, 2006

Related U.S. Application Data

(63) Continuation of application No. PCT/JP2004/016110, filed on Oct. 29, 2004.

(30) Foreign Application Priority Data

Oct. 31, 2003 (JP) .............................. 2003-373611
Dec. 19, 2003 (JP) .............................. 2003-423046

(51) Int. Cl.
*B32B 9/04* (2006.01)
*B32B 27/00* (2006.01)
*C08L 83/04* (2006.01)

(52) U.S. Cl. ...................... 428/447; 428/446; 428/1.23

(58) Field of Classification Search ................. 428/447, 428/446, 1.23
See application file for complete search history.

(56) References Cited

U.S. PATENT DOCUMENTS 3,860,557 A * 1/1975 Millar et al. ................ 523/221
5,750,197 A * 5/1998 van Ooij et al. ............ 427/308
6,011,123 A * 1/2000 Kurosawa et al. ........... 525/431
6,187,662 B1 * 2/2001 Usami et al. ................ 438/624
6,245,666 B1 * 6/2001 Ko et al. ..................... 438/623
6,261,638 B1 * 7/2001 van Ooij et al. ............ 427/379
6,413,647 B1 * 7/2002 Hayashi et al. ............. 428/447
6,452,274 B1 * 9/2002 Hasegawa et al. ........... 257/758
6,580,170 B2 6/2003 Swanson et al.
6,787,397 B2 9/2004 Swanson et al.
6,824,833 B2 * 11/2004 Nishikawa et al. .......... 427/387
2005/0112386 A1 * 5/2005 Akiyama et al. ............ 428/447

FOREIGN PATENT DOCUMENTS

| EP | 1 296 365 A2 | | 3/2003 |
|---|---|---|---|
| JP | 09-052320 | | 2/1997 |
| JP | 2001-256621 | | 9/2001 |
| JP | 2002-009066 | | 1/2002 |
| JP | 2002009066 A | * | 1/2002 |
| JP | 2002-038081 | | 2/2002 |
| JP | 2002-038091 | | 2/2002 |
| TW | 489116 | | 6/2002 |
| TW | 502377 | | 9/2002 |

OTHER PUBLICATIONS

Certified English-language translation of JP-2002009066, Jan. 2001.*
Yi-Shien Mor, "Study on IC Process Integration of Low-Dielectric-Constant Materials", (Five pages, including English Translation).

* cited by examiner

*Primary Examiner*—Randy Gulakowski
*Assistant Examiner*—Robert Loewe
(74) *Attorney, Agent, or Firm*—Oblon, Spivak, McClelland, Maier & Neustadt, P.C.

(57) ABSTRACT

A laminate including: a first silica-based film; a second silica-based film; and an organic film, wherein the second silica-based film includes an organic group containing a carbon-carbon double bond or a carbon-carbon triple bond. A method of forming the laminate includes: forming a first coating for a first silica-based film on a substrate; forming a second coating for a second silica-based film on the first coating, the second coating including an organic group containing a carbon-carbon double bond or a carbon-carbon triple bond; forming a third coating for an organic film on the second coating; and curing a multilayer film including the first to third coatings.

13 Claims, No Drawings

LAMINATE AND METHOD OF FORMING THE SAME, INSULATING FILM, AND SEMICONDUCTOR DEVICE

CROSS REFERENCE TO RELATED APPLICATION

This application is a continuation of International Patent Application No. PCT/JP2004/016110, having an international filing date of Oct. 29, 2004, which designated the United States, the entirety of which is incorporated herein by reference. Japanese Patent Application No. 2003-373611, filed on Oct. 31, 2003, and Japanese Patent Application No. 2003-423046, filed on Dec. 19, 2003, are also incorporated herein by reference in their entirety.

BACKGROUND OF THE INVENTION

The present invention relates to a laminate in which silica-based films having different compositions and an organic film are layered, a method of forming the same, an insulating film, and a semiconductor device.

A silica ($SiO_2$)-based film formed by a vacuum process such as a CVD process or an organic film containing an organic polymer as the major component has been used as an interlayer dielectric of a semiconductor device.

In recent years, a spin on glass (SOG) film, which is a coating type insulating film containing a tetraalkoxysilane hydrolysate as the major component, has been used in order to form a more uniform interlayer dielectric. Along with an increase in the degree of integration of a semiconductor device, a low-relative-dielectric-constant interlayer dielectric called an organic SOG containing an organopolysiloxane as the major component has been developed.

However, since an increase in the degree of integration of a semiconductor device has further progressed, further excellent electrical insulation between conductors has been demanded. Therefore, an interlayer dielectric material having a lower relative dielectric constant has been in demand.

As an example of such an interlayer dielectric material, a coating type composition for forming an insulating film having a low relative dielectric constant disclosed in JP-A-2001-256621 can be given. The film-forming composition disclosed in JP-A-2001-256621 is obtained by hydrolysis and condensation of an alkoxysilane in the presence of a metal catalyst. A film having a low relative dielectric constant and a high modulus of elasticity and exhibiting excellent CMP resistance can be obtained by using the film-forming composition.

In a recent semiconductor device manufacturing process, a chemical mechanical polishing (CMP) step has been widely used to planarize a multilayer film. In order to simplify the manufacturing process and to reduce processing damage to the insulating film, a method of forming an organic film on a silica-based film has been proposed. However, when the multilayer film of the silica-based film and the organic film is subjected to processing such as CMP, separation may occur between the silica-based film and the organic film due to poor adhesion between the silica-based film and the organic film.

SUMMARY

The invention may provide a laminate in which silica-based films and an organic film are layered and which has a low relative dielectric constant and exhibits excellent adhesion, and a method of forming the laminate.

The invention may also provide an insulating film including the laminate.

The invention may further provide a semiconductor device having the insulating film.

According to a first aspect of the invention, there is provided a laminate, comprising:
a first silica-based film;
a second silica-based film; and
an organic film,
wherein the second silica-based film includes an organic group containing a carbon-carbon double bond or a carbon-carbon triple bond; and
wherein the second silica-based film is a film obtained by forming a coating by using a film-forming composition which includes a hydrolysis-condensation product obtained by hydrolysis and condensation of the following silane compound (A) and the following silane compound (B) in the presence of an acidic, basic, or metal chelate compound, and curing the resulting coating;

(A) at least one silane compound selected from the group consisting of compounds shown by the following general formula (1), compounds shown by the following general formula (2), and compounds shown by the following general formula (3),

$$R_a Si(OR^1)_{4-a} \quad (1)$$

wherein R represents a hydrogen atom, a fluorine atom, or an organic group, $R^1$ represents an organic group, and a represents an integer of 1 or 2, $$Si(OR^2)_4 \quad (2)$$

wherein $R^2$ represents an organic group,

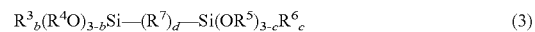

$$R^3{}_b(R^4O)_{3-b}Si-(R^7)_d-Si(OR^5)_{3-c}R^6{}_c \quad (3)$$

wherein $R^3$ to $R^6$ individually represent organic groups, b and c individually represent integers from 0 to 2, $R^7$ represents an oxygen atom, a phenylene group, or a group $-(CH_2)_m-$ (wherein m represents an integer from 1 to 6), and d represents 0 or 1; and (B) at least one silane compound selected from the group consisting of compounds shown by the following general formula (4) and compounds shown by the following general formula (5),

wherein $R_x$ represents an organic group containing a carbon-carbon double bond or a carbon-carbon triple bond, and $R^{81}$ to $R^{83}$ individually represent a hydrogen atom, a halogen atom, a hydroxyl group, an alkoxyl group, or an organic group, provided that at least one of $R^{81}$ to $R^{83}$ represents an atom or a group other than the organic group,

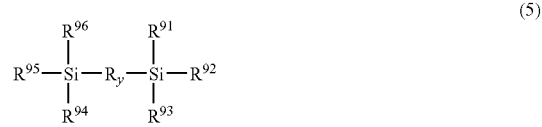

wherein $R_y$ represents a divalent organic group containing a carbon-carbon double bond or a carbon-carbon triple bond, and $R^{91}$ to $R^{96}$ individually represent a hydrogen atom, a halogen atom, a hydroxyl group, an alkoxyl group, or an organic group, provided that at least one of $R^{91}$ to $R^{93}$ and at least one of $R^{94}$ to $R^{96}$ represent an atom or a group other than the organic group.

In this laminate, the first silica-based film may be a film obtained by forming a coating by using a film-forming composition which includes a hydrolysis-condensation product obtained by hydrolysis and condensation of at least one silane compound selected from the group consisting of compounds shown by the following general formula (1), compounds shown by the following general formula (2), and compounds shown by the following general formula (3), and curing the resulting coating;

  (1)

wherein R represents a hydrogen atom, a fluorine atom, or an organic group, $R^1$ represents an organic group, and a represents 1 or 2,

  (2)

wherein $R^2$ represents an organic group,

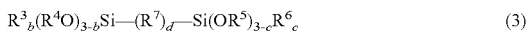  (3)

wherein $R^3$ to $R^6$ individually represent organic groups, b and c individually represent integers from 0 to 2, $R^7$ represents an oxygen atom, a phenylene group, or a group —$(CH_2)_m$— (wherein m represents an integer from 1 to 6), and d represents 0 or 1.

In this laminate, the organic film may include at least one compound selected from a polyarylene, polyarylene ether, polybenzoxazole, and polyimide.

In this laminate, the compound included in the organic film may be at least one polymer selected from the group consisting of polymers shown by the following general formulas (6) to (9);

wherein $R^8$ to $R^{12}$ individually represent a hydrocarbon group having 1 to 20 carbon atoms, a cyano group, a nitro group, an alkoxyl group having 1 to 20 carbon atoms, or a halogen atom, X represents at least one group selected from the group consisting of a group shown by —CQQ'— (wherein Q and Q' individually represent an alkyl halide group, an alkyl group, a hydrogen atom, a halogen atom, or an aryl group) and a fluorenylene group, Y represents at least one group selected from the group consisting of —O—, —CO—, —COO—, —CONH—, —S—, —$SO_2$—, and a phenylene group, e represents 0 or 1, o to s individually represent integers from 0 to 4, f is 5 to 100 mol %, g is 0 to 95 mol %, h is 0 to 95 mol % (provided that f+g+h=100 mol %), i is 0 to 100 mol %, and j is 0 to 100 mol % (provided that i+j=100 mol %); A and B individually represent at least one group selected from the group consisting of divalent aromatic groups shown by the following general formulas (10) to (12); $R^{13}$ and $R^{13'}$ individually represent a hydrogen atom or at least one group selected from the group consisting of aromatic groups shown by the following general formulas (13) and (14); and $W^1$ and $W^2$ represent at least one group selected from the group consisting of divalent aromatic group shown by the following general formulas (15) and (16),

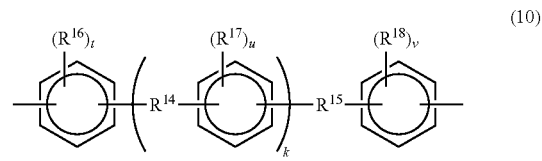  (10)

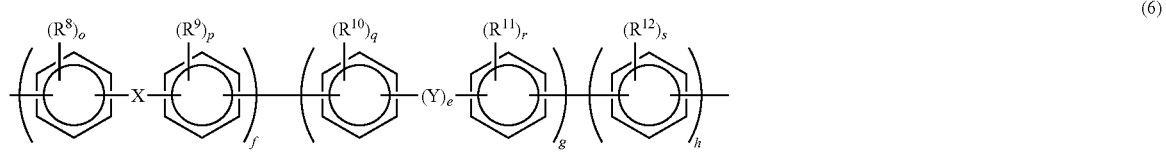  (6)

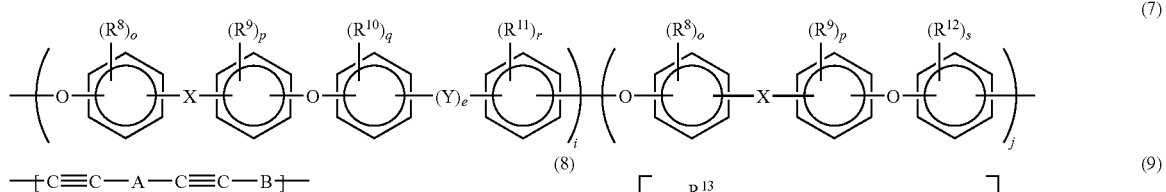  (7)

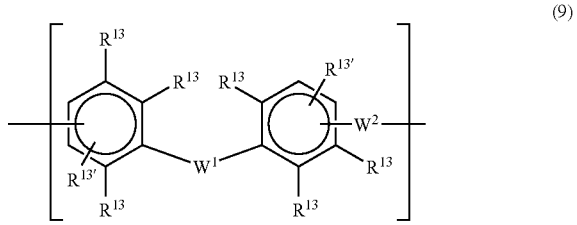

—[C≡C—A—C≡C—B]—  (8)

(9)

-continued

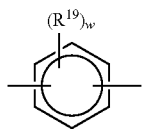
(11)

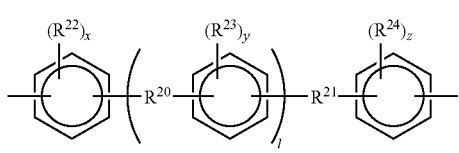
(12)

wherein $R^{14}$, $R^{15}$, $R^{20}$, and $R^{21}$ individually represent a single bond, —O—, —CO—, —CH$_2$—, —COO—, —CONH—, —S—, —SO$_2$—, phenylene group, isopropylidene group, hexafluoroisopropylidene group, diphenylmethylidene group, fluorenylene group, or group shown by the following formula,

$R^{16}$ to $R^{19}$ and $R^{22}$ to $R^{24}$ individually represent a hydrocarbon group having 1 to 20 carbon atoms, a cyano group, a nitro group, an alkoxyl group having 1 to 20 carbon atoms, or an aryl group, k represents an integer from 0 to 3, l represents an integer from 2 to 3, and t to z individually represent integers from 0 to 4,

(13)

(14)

wherein $R^{25}$ represents a halogen atom, a hydrocarbon group having 1 to 20 carbon atoms, an alkyl halide group, an alkoxyl groups having 1 to 20 carbon atoms, a phenoxy group, or an aryl group, m' represents an integer from 0 to 5, and n' represents an integer from 0 to 7,

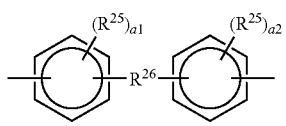
(15)

(16)

wherein $R^{25}$ represents a halogen atom, a hydrocarbon group having 1 to 20 carbon atoms, an alkyl halide group, an alkoxyl group having 1 to 20 carbon atoms, a phenoxy group, or an aryl group, $R^{26}$ represents a single bond, —O—, —CO—, —CH$_2$—, —COO—, —CONH—, —S—, —SO$_2$—, phenylene group, isopropylidene group, hexafluoroisopropylidene group, diphenylmethylidene group, methylphenylmethylidene group, trifluoromethylmethylidene group, trifluoromethylphenylmethylidene group, fluorenylene group, or group shown by the following formula,

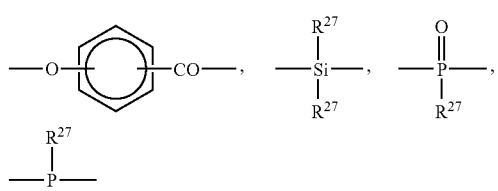

(wherein $R^{27}$ individually represents a hydrogen atom, a hydrocarbon group having 1 to 4 carbon atoms, or a phenyl group), a1 and a2 individually represent integers from 0 to 4, and a3 represents an integer from 0 to 6.

The laminate may have a relative dielectric constant of 2.8 or less.

According to a second aspect of the invention, there is provided a method of forming a laminate, the method comprising:

forming a first coating for a first silica-based film on a substrate;

forming a second coating for a second silica-based film on the first coating, the second coating including an organic group containing a carbon-carbon double bond or a carbon-carbon triple bond;

forming a third coating for an organic film on the second coating; and curing a multilayer film including the first to third coatings.

In this method of forming a laminate, the multilayer film may be cured by heating.

In this method of forming a laminate, the multilayer film may be cured by applying electron beams.

According to a third aspect of the invention, there is provided an insulating film, comprising any of the above-described laminates.

According to a fourth aspect of the invention, there is provided a semiconductor device, comprising the above-described insulating film.

In this laminate, the second silica-based film is provided between the first silica-based film and the organic film. Since the film-forming composition for forming the second silica-based film contains a carbon-carbon double bond or a carbon-carbon triple bond in the polymer skeleton, the polymer can react with another organic polymer by application of heat or electron beams, for example. Since the second silica-based film includes an unreacted silanol group in the polymer, the second silica-based film can be condensed with the coating for forming another silica-based film by application of heat. Specifically, the second silica-based film has adhesion to both the first silica-based film and the organic film. Therefore, a laminate having a low dielectric constant and exhibiting sufficient adhesion can be provided. As a result, an insulating film which can be suitably used as an interlayer dielectric or a planarization insulating film for a semiconductor device can be provided.

The "coating" used in the invention means a film obtained by applying a film-forming composition to a substrate and removing an organic solvent.

According to the above method of forming a laminate, the curing treatment is performed after layering the coatings for the first silica-based film, the second silica-based film, and the organic film. When performing the curing treatment in a state in which the coatings are layered, the carbon-carbon double bond or carbon-carbon triple bond of the second silica-based film reacts with the organic polymer. On the other hand, an unreacted silanol group in the coating for the second silica-based film undergoes a condensation reaction with the coating for the first silica-based film. Therefore, a laminate in which the first silica-based film and the organic film sufficiently adhere through the second silica-based film can be formed.

According to the above insulating film, an insulating film having a low dielectric constant and exhibiting improved adhesion can be provided. Therefore, the insulating film can be suitably used as an interlayer dielectric or a planarization insulating film for a semiconductor device.

The above semiconductor device includes the above-described insulating film. Since the insulating film exhibits excellent adhesion, a highly reliable semiconductor device, in which film separation during CMP processing or packaging is prevented, can be provided.

DETAILED DESCRIPTION OF THE EMBODIMENT

The laminate and the method of forming the same, the insulating film, and the semiconductor device of the invention are described below in detail.

1. Laminate

In the laminate of the invention, the second silica-based film which includes an organic group containing a carbon-carbon double bond or a carbon-carbon triple bond is provided between the first silica-based film and the organic film. Each film is described below.

1.1 First Silica-based Film

The first silica-based film is a film obtained by curing a coating formed by using a film-forming composition (I) which includes a hydrolysis-condensation product produced by hydrolysis and condensation of at least one silane compound selected from the group consisting of compounds shown by the following general formula (1) (hereinafter referred to as "compound 1"), compounds shown by the following general formula (2) (hereinafter referred to as "compound 2"), and compounds shown by the following general formula (3) (hereinafter referred to as "compound 3"):

$$R_aSi(OR^1)_{4-a} \quad (1)$$

wherein R represents a hydrogen atom, a fluorine atom, or an organic group, $R^1$ represents an organic group, and a represents an integer of 1 or 2,

$$Si(OR^2)_4 \quad (2)$$

wherein $R^2$ represents an organic group,

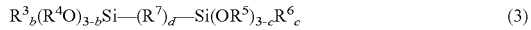

$$R^3{}_b(R^4O)_{3-b}Si-(R^7)_d-Si(OR^5)_{3-c}R^6{}_c \quad (3)$$

wherein $R^3$ to $R^6$ individually represent organic groups, b and c individually represent integers from 0 to 2, $R^7$ represents an oxygen atom, a phenylene group, or a group —$(CH_2)_m$— (wherein m represents an integer from 1 to 6), and d represents 0 or 1.

In the "hydrolysis product (hydrolysate)" used in the invention, all alkoxy groups included in at least one silane compound selected from the compounds 1 to 3 need not be necessarily hydrolyzed. For example, the "hydrolysis product" may be a product in which only one alkoxy group is hydrolyzed, a product in which two or more alkoxy groups are hydrolyzed, or a mixture of these products. The "condensation product (condensate)" used herein means a product in which silanol groups in the hydrolysis product of the compounds 1 to 3 are condensed to form an Si—O—Si bond. In the invention, all of the silanol groups need not be necessarily condensed. The "condensation product" is a concept including a product in which only some silanol groups are condensed, a mixture of products with different degrees of condensation, and the like.

1.1.1 Compound 1

In the general formula (1), as the organic group represented by R and $R^1$, an alkyl group, aryl group, allyl group, glycidyl group, and the like can be given. In the general formula (1), R is preferably an organic group, particularly an alkyl group or an aryl group. As examples of the alkyl group, a methyl group, an ethyl group, a propyl group, a butyl group, and the like can be given. The alkyl group preferably includes 1 to 5 carbon atoms. The alkyl group may be either linear or branched. A hydrogen atom in the alkyl group may be replaced by a fluorine atom or the like. As examples of the aryl group in the formula (1), a phenyl group, naphthyl group, methylphenyl group, ethylphenyl group, chlorophenyl group, bromophenyl group, fluorophenyl group, and the like can be given.

Examples of compounds preferable as the compound 1 include: trimethoxysilane, triethoxysilane, tri-n-propoxysilane, triisopropoxysilane, tri-n-butoxysilane, tri-sec-butoxysilane, tri-tert-butoxysilane, triphenoxysilane, fluorotrimethoxysilane, fluorotriethoxysilane, fluorotri-n-propoxysilane, fluorotriisopropoxysilane, fluorotri-n-butoxysilane, fluorotri-sec-butoxysilane, fluorotri-tert-butoxysilane, fluorotriphenoxysilane, methyltrimethoxysilane, methyltriethoxysilane, methyltri-n-propoxysilane, methyltriisopropoxysilane, methyltri-n-butoxysilane, methyltri-sec-butoxysilane, methyltri-tert-butoxysilane, methyltriphenoxysilane, ethyltrimethoxysilane, ethyltriethoxysilane, ethyltri-n-propoxysilane, ethyltriisopropoxysilane, ethyltri-n-butoxysilane, ethyltri-sec-butoxysilane, ethyltri-tert-butoxysilane, ethyltriphenoxysilane, vinyltrimethoxysilane, vinyltriethoxysilane, vinyltri-n-propoxysilane, vinyltriisopropoxysilane, vinyltri-n-butoxysilane, vinyltri-sec-butoxysilane, vinyltri-tert-butoxysilane, vinyltriphenoxysilane, n-propyltrimethoxysilane, n-propyltriethoxysilane, n-propyltri-n-propoxysilane, n-propyltriisopropoxysilane, n-propyltri-n-butoxysilane, n-propyltri-sec-butoxysilane, n-propyltri-tert-butoxysilane, n-propyltriphenoxysilane, isopropyltrimethoxysilane, isopropyltriethoxysilane, isopropyltri-n-propoxysilane, isopropyltriisopropoxysilane, isopropyltri-n-butoxysilane, isopropyltri-sec-butoxysilane, isopropyltri-tert-butoxysilane, isopropyltriphenoxysilane, n-butyltrimethoxysilane, n-butyltriethoxysilane, n-butyltri-n-propoxysilane, n-butyltriisopropoxysilane, n-butyltri-n-butoxysilane, n-butyltri-sec-butoxysilane, n-butyltri-tert-butoxysilane, n-butyltriphenoxysilane, sec-butyltrimethoxysilane, sec-butyltriethoxysilane, sec-butyltri-n-propoxysilane, sec-butyltriisopropoxysilane, sec-butyltri-n-butoxysilane, sec-butyltri-sec-butoxysilane, sec-butyltri-tert-butoxysilane, sec-butyltriphenoxysilane, t-butyltrimethoxysilane, t-butyltriethoxysilane, t-butyltri-n-propoxysilane, t-butyltriisopropoxysilane, t-butyltri-n-butoxysilane, t-butyltri-secbutoxysilane, t-butyltri-tert-butoxysilane, t-butyltriphenoxysilane, phenyltrimethoxysilane, phenyltriethoxysilane, phenyltri-n-propoxysilane, phenyltriisopropoxysilane, phenyltri-n-butoxysilane, phenyltri-sec-butoxysilane, phenyltri-tert-butoxysilane, phenyltriphenoxysilane, γ-aminopropyltrimethoxysilane, γ-aminopropyltriethoxysilane, γ-glycidoxypropyltrimethoxysilane, γglycidoxypropyltriethoxysilane, γ-trifluoropropyltrimethoxysilane, γ-trifluoropropyltriethoxysilane; dimethyldimethoxysilane, dimethyldiethoxysilane, dimethyldi-n-propoxysilane, dimethyldiisopropoxysilane, dimethyldi-n-butoxysilane, dimethyldi-sec-butoxysilane, dimethyldi-tert-butoxysilane, dimethyldiphenoxysilane, diethyldimethoxysilane, diethyldiethoxysilane, diethyldi-n-propoxysilane, diethyldiisopropoxysilane, diethyldi-n-butoxysilane, diethyldi-sec-butoxysilane, diethyldi-tert-butoxysilane, diethyldiphenoxysilane, di-n-propyldimethoxysilane, di-n-propyldiethoxysilane, di-n-propyldi-n-propoxysilane, di-n-propyldiisopropoxysilane, di-n-propyldi-n-butoxysilane, di-n-propyldi-sec-butoxysilane, di-n-propyldi-tert-butoxysilane, di-n-propyldiphenoxysilane, diisopropyldimethoxysilane, diisopropyldiethoxysilane, diisopropyldi-n-propoxysilane, diisopropyldiisopropoxysilane, diisopropyldi-n-butoxysilane, diisopropyldi-sec-butoxysilane, diisopropyldi-tert-butoxysilane, diisopropyldiphenoxysilane, di-n-butyldimethoxysilane, di-n-butyldiethoxysilane, di-n-butyldi-n-propoxysilane, di-n-butyldiisopropoxysilane, di-n-butyldi-n-butoxysilane, di-n-butyldi-sec-butoxysilane, di-n-butyldi-tert-butoxysilane, di-n-butyldiphenoxysilane, di-sec-butyldimethoxysilane, di-sec-butyldiethoxysilane, di-sec-butyldi-n-propoxysilane, di-sec-butyldiisopropoxysilane, di-sec-butyldi-n-butoxysilane, di-sec-butyldi-sec-butoxysilane, di-sec-butyldi-tert-butoxysilane, di-sec-butyldiphenoxysilane, di-tert-butyldimethoxysilane, di-tert-butyldiethoxysilane, di-tert-butyldi-n-propoxysilane, di-tert-butyldiisopropoxysilane, di-tert-butyldi-n-butoxysilane, di-tert-butyldi-sec-butoxysilane, di-tert-butyldi-tert-butoxysilane, di-tert-butyldiphenoxysilane, diphenyldimethoxysilane, diphenyldiethoxysilane, diphenyldi-n-propoxysilane, diphenyldiisopropoxysilane, diphenyldi-n-butoxysilane, diphenyldi-sec-butoxysilane, diphenyldi-tert-butoxysilane, diphenyldiphenoxysilane, divinyldimethoxysilane, di-γ-aminopropyldimethoxysilane, di-γ-glycidoxypropyldimethoxysilane, di-γ-trifluoropropyldimethoxysilane; and the like.

Of these compounds, methyltrimethoxysilane, methyltriethoxysilane, methyltri-n-propoxysilane, methyltriisopropoxysilane, ethyltrimethoxysilane, ethyltriethoxysilane, vinyltrimethoxysilane, vinyltriethoxysilane, phenyltrimethoxysilane, phenyltriethoxysilane, dimethyldimethoxysilane, dimethyldiethoxysilane, diethyldimethoxysilane, diethyldiethoxysilane, diphenyldimethoxysilane, and diphenyldiethoxysilane are preferable. Methyltrimethoxysilane, methyltriethoxysilane, ethyltrimethoxysilane, vinyltrimethoxysilane, phenyltrimethoxysilane, dimethyldimethoxysilane, and dimethyldiethoxysilane are particularly preferable. These compounds may be used either individually or in combination of two or more.

1.1.2 Compound 2

In the general formula (2), as examples of the organic group represented by $R^2$, the organic groups given as examples for the general formula (1) can be given. As specific examples of the compound 2, tetramethoxysilane, tetraethoxysilane, tetra-n-propoxysilane, tetraisopropoxysilane, tetra-n-butoxysilane, tetra-sec-butoxysilane, tetra-tert-butoxysilane, tetraphenoxysilane, and the like can be given. Of these compounds, tetramethoxysilane, tetraethoxysilane, tetra-n-propoxysilane, tetraisopropoxysilane, and tetraphenoxysilane are preferable. Tetramethoxysilane and tetraethoxysilane are particularly preferable. These compounds may be used either individually or in combination of two or more.

1.1.3 Compound 3

In the general formula (3), as examples of the organic group represented by $R^3$ to $R^6$, the organic groups given as examples for the general formula (1) can be given. As examples of the compound 3 in which $R^7$ in the general formula (3) is an oxygen atom, hexamethoxydisiloxane, hexaethoxydisiloxane, hexaphenoxydisiloxane, 1,1,1,3,3-pentamethoxy-3-methyldisiloxane, 1,1,1,3,3-pentaethoxy-3-methyldisiloxane, 1,1,1,3,3-pentaphenoxy-3-methyldisiloxane, 1,1,1,3,3-pentamethoxy-3-ethyldisiloxane, 1,1,1,3,3-pentaethoxy-3-ethyldisiloxane, 1,1,1,3,3-pentaphenoxy-3-ethyldisiloxane, 1,1,1,3,3-pentamethoxy-3-phenyldisiloxane, 1,1,1,3,3-pentamethoxy-3-phenyldisiloxane, 1,1,1,3,3-pentaphenoxy-3-phenyldisiloxane, 1,1,1,3,3-pentaphenoxy-3-phenyldisiloxane, 1,1,3,3-tetramethoxy-1,3-dimethyldisiloxane, 1,1,3,3-tetraethoxy-1,3-dimethyldisiloxane, 1,1,3,3-tetraphenoxy-1,3-dimethyldisiloxane, 1,1,3,3-tetramethoxy-1,3-diethyldisiloxane, 1,1,3,3-tetraethoxy-1,3-diethyldisiloxane, 1,1,3,3-tetraphenoxy-1,3-diethyldisiloxane, 1,1,3,3-tetramethoxy-1,3-diphenyldisiloxane, 1,1,3,3-tetraethoxy-1,3-diphenyldisiloxane, 1,1,3,3-tetraphenoxy-1,3-diphenyldisiloxane, 1,1,3-trimethoxy-1,3,3-trimethyldisiloxane, 1,1,3-triethoxy-1,3,3-trimethyldisiloxane, 1,1,3-triphenoxy-1,3,3-trimethyldisiloxane, 1,1,3-trimethoxy-1,3,3-triethyldisiloxane, 1,1,3-triethoxy-1,3,3-triethyldisiloxane, 1,1,3-triphenoxy-1,3,3-triethyldisiloxane, 1,1,3-trimethoxy-1,3,3-triphenyldisiloxane, 1,1,3-triethoxy-1,3,3-triphenyldisiloxane, 1,1,3-triphenoxy-1,3,3-triphenyldisiloxane, 1,3-dimethoxy-1,1,3,3-tetramethyldisiloxane, 1,3-diethoxy-1,1,3,3-tetramethyldisiloxane, 1,3-diphenoxy-1,1,3,3-tetramethyldisiloxane, 1,3-dimethoxy-1,1,3,3-tetraethyldisiloxane, 1,3-diethoxy-1,1,3,3-tetraethyldisiloxane, 1,3-diphenoxy-1,1,3,3-tetraethyldisiloxane, 1,3-dimethoxy-1,1,3,3-tetraphenyldisiloxane, 1,3-diethoxy-1,1,3,3-tetraphenyldisiloxane, and 1,3-diphenoxy-1,1,3,3-tetraphenyldisiloxane, and the like can be given.

Of these compounds, hexamethoxydisiloxane, hexaethoxydisiloxane, 1,1,3,3-tetramethoxy-1,3-dimethyldisiloxane, 1,1,3,3-tetraethoxy-1,3-dimethyldisiloxane, 1,1,3,3-tetramethoxy-1,3-diphenyldisiloxane, 1,3-dimethoxy-1,1,3,3-tetramethyldisiloxane, 1,3-diethoxy-1,1,3,3-tetramethyldisiloxane, 1,3-dimethoxy-1,1,3,3-tetraphenyldisiloxane, 1,3-diethoxy-1,1,3,3-tetraphenyldisiloxane, and the like are preferable.

As examples of the compound in which $R^7$ in the general formula (3) is a phenylene group, 1,2-bis(trimethoxysilyl)benzene, 1,2-bis(triethoxysilyl)benzene, 1,2-bis(tri-n-propoxysilyl)benzene, 1,2-bis(triisopropoxysilyl)benzene, 1,2-bis(tri-n-butoxysilyl)benzene, 1,2-bis(tri-sec-butoxysilyl)benzene, 1,2-bis(tri-tert-butoxysilyl)benzene, 1,3-bis(trimethoxysilyl)benzene, 1,3-bis(triethoxysilyl)benzene, 1,3-bis(tri-n-propoxysilyl)benzene, 1,3-bis(triisopropoxysilyl)benzene, 1,3-bis(tri-n-butoxysilyl)benzene, 1,3-bis(tri-sec-butoxysilyl)benzene, 1,3-bis(tri-tert-butoxysilyl)benzene, 1,4-bis(trimethoxysilyl)benzene, 1,4-bis(triethoxysilyl)benzene, 1,4-bis(tri-n-propoxysilyl)benzene, 1,4-bis(triisopropoxysilyl)benzene, 1,4-bis(tri-n-butoxysilyl)benzene, 1,4-bis(tri-sec-butoxysilyl)benzene, 1,4-bis(tri-tert-butoxysilyl)benzene, and the like can be given.

Of these compounds, 1,2-bis(trimethoxysilyl)benzene, 1,2-bis(triethoxysilyl)benzene, 1,3-bis(trimethoxysilyl)benzene, 1,3-bis(triethoxysilyl)benzene, 1,4-bis(trimethoxysilyl)benzene, 1,4-bis(triethoxysilyl)benzene, and the like are preferable.

As examples of the compound in which $R^7$ in the formula (3) is the group —$(CH_2)_m$—, bis(trimethoxysilyl)methane, bis(triethoxysilyl)methane, bis(tri-n-propoxysilyl)methane, bis(triisopropoxysilyl)methane, bis(tri-n-butoxysilyl)methane, bis(tri-sec-butoxysilyl)methane, bis(tri-t-butoxysilyl)methane, 1,2-bis(trimethoxysilyl)ethane, 1,2-bis(triethoxysilyl)ethane, 1,2-bis(tri-n-propoxysilyl)ethane, 1,2-bis(triisopropoxysilyl)ethane, 1,2-bis(tri-n-butoxysilyl)ethane, 1,2-bis(tri-sec-butoxysilyl)ethane, 1,2-bis(tri-t-butoxysilyl)ethane, 1-(dimethoxymethylsilyl)-1-(trimethoxysilyl)methane, 1-(diethoxymethylsilyl)-1-(triethoxysilyl)methane, 1-(di-n-propoxymethylsilyl)-1-(tri-n-propoxysilyl)methane, 1-(diisopropoxymethylsilyl)-1-(triisopropoxysilyl)methane, 1-(di-n-butoxymethylsilyl)-1-(tri-n-butoxysilyl)methane, 1-(di-sec-butoxymethylsilyl)-1-(tri-sec-butoxysilyl)methane, 1-(di-t-butoxymethylsilyl)-1-(tri-t-butoxysilyl)methane, 1-(dimethoxymethylsilyl)-2-(trimethoxysilyl)ethane, 1-(diethoxymethylsilyl)-2-(triethoxysilyl)ethane, 1-(di-n-propoxymethylsilyl)-2-(tri-n-propoxysilyl)ethane, 1-(diisopropoxymethylsilyl)-2-(triisopropoxysilyl)ethane, 1-(di-n-butoxymethylsilyl)-2-(tri-n-butoxysilyl)ethane, 1-(di-sec-butoxymethylsilyl)-2-(tri-sec-butoxysilyl)ethane, 1-(di-t-butoxymethylsilyl)-2-(tri-t-butoxysilyl)ethane, bis(dimethoxymethylsilyl)methane, bis(diethoxymethylsilyl)methane, bis(di-n-propoxymethylsilyl)methane, bis(diisopropoxymethylsilyl)methane, bis(di-n-butoxymethylsilyl)methane, bis(di-sec-butoxymethylsilyl)methane, bis(di-t-butoxymethylsilyl)methane, 1,2-bis(dimethoxymethylsilyl)ethane, 1,2-bis(diethoxymethylsilyl)ethane, 1,2-bis(di-n-propoxymethylsilyl)ethane, 1,2-bis(diisopropoxymethylsilyl)ethane, 1,2-bis(di-n-butoxymethylsilyl)ethane, 1,2-bis(di-sec-butoxymethylsilyl)ethane, 1,2-bis(di-t-butoxymethylsilyl)ethane, and the like can be given. Of these compounds, bis(trimethoxysilyl)methane, bis(triethoxysilyl)methane, 1,2-bis(trimethoxysilyl)ethane, 1,2-bis(triethoxysilyl)ethane, 1-(dimethoxymethylsilyl)-1-(trimethoxysilyl)methane, 1-(diethoxymethylsilyl)-1-(triethoxysilyl)methane, 1-(dimethoxymethylsilyl)-2-(trimethoxysilyl)ethane, 1-(diethoxymethylsilyl)-2-(triethoxysilyl)ethane, bis(dimethoxymethylsilyl)methane, bis(diethoxymethylsilyl)methane, 1,2-bis(dimethoxymethylsilyl)ethane, 1,2-bis(diethoxymethylsilyl)ethane, and the like are preferable.

As examples of the compounds shown by the general formula (3) in which d is 0, hexamethoxydisilane, hexaethoxydisilane, hexaphenoxydisilane, 1,1,1,2,2-pentamethoxy-2-methyldisilane, 1,1,1,2,2-pentaethoxy-2-methyldisilane, 1,1,1,2,2-pentaphenoxy-2-methyldisilane, 1,1,1,2,2-pentamethoxy-2-ethyldisilane, 1,1,1,2,2-pentaethoxy-2-ethyldisilane, 1,1,1,2,2-pentaphenoxy-2-ethyldisilane, 1,1,1,2,2-pentamethoxy-2-phenyldisilane, 1,1,1,2,2-pentaethoxy-2-phenyldisilane, 1,1,1,2,2-pentaphenoxy-2-phenyldisilane, 1,1,2,2-tetramethoxy-1,2-dimethyldisilane, 1,1,2,2-tetraethoxy-1,2-dimethyldisilane, 1,1,2,2-tetraphenoxy-1,2-dimethyldisilane, 1,1,2,2-tetramethoxy-1,2-diethyldisilane, 1,1,2,2-tetraethoxy-1,2-diethyldisilane, 1,1,2,2-tetraphenoxy-1,2-diethyldisilane, 1,1,2,2-tetramethoxy-1,2-diphenyldisilane, 1,1,2,2-tetraethoxy-1,2-diphenyldisilane, 1,1,2,2-tetraphenoxy-1,2-diphenyldisilane, 1,1,2-trimethoxy-1,2,2-trimethyldisilane, 1,1,2-triethoxy-1,2,2-trimethyldisilane, 1,1,2-triphenoxy-1,2,2-trimethyldisilane, 1,1,2-trimethoxy-1,2,2-triethyldisilane, 1,1,2-triethoxy-1,2,2-triethyldisilane, 1,1,2-triphenoxy-1,2,2-triethyldisilane, 1,1,2-trimethoxy-1,2,2-triphenyldisilane, 1,1,2-triethoxy-1,2,2-triphenyldisilane, 1,1,2-triphenoxy-1,2,2-triphenyldisilane, 1,2-dimethoxy-1,1,2,2-tetramethyldisilane, 1,2-diethoxy-1,1,2,2-tetramethyldisilane, 1,2-diphenoxy-1,1,2,2-tetramethyldisilane, 1,2-dimethoxy-1,1,2,2-tetraethyldisilane, 1,2-diethoxy-1,1,2,2-tetraethyldisilane, 1,2-diphenoxy-1,1,2,2-tetraethyldisilane, 1,2-dimethoxy-1,1,2,2-tetraphenyldisilane, 1,2-diethoxy-1,1,2,2-tetraphenyldisilane, 1,2-diphenoxy-1,1,2,2-tetraphenyldisilane, and the like can be given.

Of these, hexamethoxydisilane, hexaethoxydisilane, 1,1,2,2-tetramethoxy-1,2-dimethyldisilane, 1,1,2,2-tetraethoxy-1,2-dimethyldisilane, 1,1,2,2-tetramethoxy-1,2-diphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane, 1,2-diethoxy-1,1,2,2-tetraphenyldisilane, and the like are preferable.

In the invention, at least one of the compounds 1 to 3 is used. Each of the compounds 1 to 3 may be used either individually or in combination of two or more. A hydrolysis-condensation product of the compound 1 and the compound 2 is preferable from the viewpoint of excellent storage stability of the resulting composition.

1.1.4 Metal Chelate Compound, Acidic Compound, or Basic Compound

In the invention, hydrolysis and condensation of the compounds 1 to 3 may be carried out in the presence of a metal chelate compound, an acidic compound, or a basic compound. The metal chelate compound, the acidic compound, and the basic compound are described below.

1.1.4a Metal Chelate Compound

The metal chelate compound which may be used at the time of hydrolysis and condensation of the silane compound selected from the compounds 1 to 3 is shown by the following general formula (1):

$$R^{27}{}_\beta M(OR^{28})_{\alpha-\beta} \tag{17}$$

wherein $R^{27}$ represents a chelating agent, M represents a metal atom, $R^{28}$ represents an alkyl group having 2 to 5 carbon atoms or an aryl group having 6 to 20 carbon atoms, α represents the valence of the metal M, and β represents an integer from 1 to α.

As the metal M, at least one metal selected from the group IIIB metals (aluminum, gallium, indium, and thallium) and the group IVA metals (titanium, zirconium, and hafnium) is preferable, with titanium, aluminum, and zirconium being still more preferable.

As specific examples of the metal chelate compound, titanium chelate compounds such as triethoxy-mono(acetylacetonato)titanium, tri-n-propoxy.mono(acetylacetonato)titanium, triisopropoxy.mono(acetylacetonato)titanium, tri-n-butoxy.mono(acetylacetonato)titanium, tri-sec-butoxy.mono(acetylacetonato)titanium, tri-t-butoxy.mono(acetylacetonato)titanium, diethoxy.bis(acetylacetonato)titanium, di-n-propoxy.bis(acetylacetonato)titanium, diisopropoxy.bis(acetylacetonato)titanium, di-n-butoxy.bis(acetylacetonato)titanium, di-sec-butoxy.bis(acetylacetonato)titanium, di-t-butoxy.bis(acetylacetonato)titanium, monoethoxy.tris(acetylacetonato)titanium, mono-n-propoxy.tris(acetylacetonato)titanium, monoisopropoxy.tris(acetylacetonato)titanium, mono-n-butoxy.tris(acetylacetonato)titanium, mono-sec-butoxy.tris(acetylacetonato)titanium, mono-t-butoxy.tris(acetylacetonato)titanium, tetrakis(acetylacetonato)titanium, triethoxy.mono(ethylacetoacetate)titanium, tri-n-propoxy.mono(ethylacetoacetate)titanium, triisopropoxy.mono(ethylacetoacetate)titanium, tri-n-butoxy.mono(ethylacetoacetate)titanium, tri-sec-butoxy.mono(ethylacetoacetate)titanium, tri-t-butoxy.mono(ethylacetoacetate)titanium, diethoxy.bis(ethylacetoacetate)titanium, di-n-propoxy.bis(ethylacetoacetate)titanium, diisopropoxy.bis(ethylacetoacetate)titanium, di-n-butoxy.bis(ethylacetoacetate)titanium, di-sec-butoxy.bis(ethylacetoacetate)titanium, di-t-butoxy.bis(ethylacetoacetate)titanium, monoethoxy.tris(ethylacetoacetate)titanium, mono-n-propoxy.tris(ethylacetoacetate)titanium, monoisopropoxy.tris(ethylacetoacetate)titanium, mono-n-butoxy.tris(ethylacetoacetate)titanium, mono-sec-butoxy.tris(ethylacetoacetate)titanium, mono-t-butoxy.tris(ethylacetoacetate)titanium, tetrakis(ethylacetoacetate)titanium, mono(acetylacetonato)tris(ethylacetoacetate)titanium, bis(acetylacetonato)bis(ethylacetoacetate)titanium, and tris(acetylacetonato)mono(ethylacetoacetate)titanium; zirconium chelate compounds such as triethoxy.mono(acetylacetonato)zirconium, tri-n-propoxy.mono(acetylacetonato)zirconium, triisopropoxy.mono(acetylacetonato)zirconium, tri-n-butoxy.mono(acetylacetonato)zirconium, tri-sec-butoxy.mono(acetylacetonato)zirconium, tri-t-butoxy.mono(acetylacetonato)zirconium, diethoxy.bis(acetylacetonato)zirconium, di-n-propoxy.bis(acetylacetonato)zirconium, diisopropoxy.bis(acetylacetonato)zirconium, di-n-butoxy.bis(acetylacetonato)zirconium, di-sec-butoxy.bis(acetylacetonato)zirconium, di-t-butoxy.bis(acetylacetonato)zirconium, monoethoxy.tris(acetylacetonato)zirconium, mono-n-propoxy.tris(acetylacetonato)zirconium, monoisopropoxy.tris(acetylacetonato)zirconium, mono-n-butoxy.tris(acetylacetonato)zirconium, mono-sec-butoxy.tris(acetylacetonato)zirconium, mono-t-butoxy.tris(acetylacetonato)zirconium, tetrakis(acetylacetonato)zirconium, triethoxy.mono(ethylacetoacetate)zirconium, tri-n-propoxy.mono(ethylacetoacetate)zirconium, triisopropoxy.mono(ethylacetoacetate)zirconium, tri-n-butoxy.mono(ethylacetoacetate)zirconium, tri-sec-butoxy.mono(ethylacetoacetate)zirconium, tri-t-butoxy.mono(ethylacetoacetate)zirconium, diethoxy.bis(ethylacetoacetate)zirconium, di-n-propoxy.bis(ethylacetoacetate)zirconium, diisopropoxy.bis(ethylacetoacetate)zirconium, di-n-butoxy.bis(ethylacetoacetate)zirconium, di-sec-butoxy.bis(ethylacetoacetate)zirconium, di-t-butoxy.bis(ethylacetoacetate)zirconium, monoethoxy.tris(ethylacetoacetate)zirconium, mono-n-propoxy.tris(ethylacetoacetate)zirconium, monoisopropoxy.tris(ethylacetoacetate)zirconium, mono-n-butoxy.tris(ethylacetoacetate)zirconium, mono-sec-butoxy.tris(ethylacetoacetate)zirconium, mono-t-butoxy-tris(ethylacetoacetate)zirconium, tetrakis(ethylacetoacetate)zirconium, mono(acetylacetonato)tris(ethylacetoacetate)zirconium, bis(acetylacetonato)bis(ethylacetoacetate)zirconium, and tris(acetylacetonato)mono(ethylacetoacetate)zirconium; and aluminum chelate compounds such as triethoxy.mono(acetylacetonato)aluminum, tri-n-propoxy.mono(acetylacetonato)aluminum, triisopropoxy.mono(acetylacetonato)aluminum, tri-n-butoxy.mono(acetylacetonato)aluminum, tri-sec-butoxy.mono(acetylacetonato)aluminum, tri-t-butoxy.mono(acetylacetonato)aluminum, diethoxy.bis(acetylacetonato)aluminum, di-n-propoxy.bis(acetylacetonato)aluminum, diisopropoxy.bis(acetylacetonato)aluminum, di-n-butoxy.bis(acetylacetonato)aluminum, di-sec-butoxy.bis(acetylacetonato)aluminum, di-t-butoxy.bis(acetylacetonato)aluminum, monoethoxy.tris(acetylacetonato)aluminum, mono-n-propoxy.tris(acetylacetonato)aluminum, monoisopropoxy.tris(acetylacetonato)aluminum, mono-n-butoxy.tris(acetylacetonato)aluminum, mono-sec-butoxy.tris(acetylacetonato)aluminum, mono-t-butoxy.tris(acetylacetonato)aluminum, triethoxy.mono(ethylacetoacetate)aluminum, tri-n-propoxy.mono(ethylacetoacetate)aluminum, triisopropoxy.mono(ethylacetoacetate)aluminum, tri-n-butoxy.mono(ethylacetoacetate)aluminum, tri-sec-butoxy.mono(ethylacetoacetate)aluminum, tri-t-butoxy.mono(ethylacetoacetate)aluminum, diethoxy.bis(ethylacetoacetate)aluminum, di-n-propoxy.bis(ethylacetoacetate)aluminum, diisopropoxy.bis(ethylacetoacetate)aluminum, di-n-butoxy.bis(ethylacetoacetate)aluminum, di-sec-butoxy.bis(ethylacetoacetate)aluminum, di-t-butoxy.bis(ethylacetoacetate)aluminum, monoethoxy.tris(ethylacetoacetate)aluminum, mono-n-propoxy.tris(ethylacetoacetate)aluminum, monoisopropoxy.tris(ethylacetoacetate)aluminum, mono-n-butoxy tris(ethylacetoacetate)aluminum, mono-sec-butoxy.tris(ethylacetoacetate)aluminum, mono-t-butoxy.tris(ethylacetoacetate)aluminum, tetrakis(ethylacetoacetate)aluminum, mono(acetylacetonato)tris(ethylacetoacetate)aluminum, bis(acetylacetonato)bis(ethylacetoacetate)aluminum, and tris(acetylacetonato)mono(ethylacetoacetate)aluminum can be given.

In particular, at least one of $(CH_3(CH_3)HCO)_{4-t}Ti$ $(CH_3COCH_2COCH_3)_t$, $(CH_3(CH_3)HCO)_{4-t}Ti$ $(CH_3COCH_2COOC_2H_5)_t$, $(C_4H_9O)_{4-t}Ti$ $(CH_3COCH_2COCH_3)_t$, $(C_4H_9O)_{4-t}Ti$ $(CH_3COCH_2COOC_2H_5)_t$, $(C_2H_5(CH_3)CO)_{4-t}Ti$ $(CH_3COCH_2COCH_3)_t$, $(C_2H_5(CH_3)CO)_{4-t}Ti$ $(CH_3COCH_2COOC_2H_5)_t$, $(CH_3(CH_3)HCO)_{4-t}Zr$ $(CH_3COCH_2COCH_3)_t$, $(CH_3(CH_3)HCO)_{4-t}Zr$ $(CH_3COCH_2COOC_2H_5)_t$, $(C_4H_9O)_{4-t}Zr$ $(CH_3COCH_2COCH_3)_t$, $(C_4H_9O)_{4-t}Zr$ $(CH_3COCH_2COOC_2H_5)_t$, $(C_2H_5(CH_3)CO)_{4-t}Zr$ $(CH_3COCH_2COCH_3)_t$, $(C_2H_5(CH_3)CO)_{4-t}Zr$ $(CH_3COCH_2COOC_2H_5)_t$, $(CH_3(CH_3)HCO)_{3-t}Al$ $(CH_3COCH_2COCH_3)_t$, $(CH_3(CH_3)HCO)_{3-t}Al$ $(CH_3COCH_2COOC_2H_5)_t$, $(C_4H_9O)_{3-t}Al$ $(CH_3COCH_2COCH_3)_t$, $(C_4H_9O)_{3-t}Al$ $(CH_3COCH_2COOC_2H_5)_t$, $(C_2H_5(CH_3)CO)_{3-t}Al$ $(CH_3COCH_2COCH_3)_t$, $(C_2H_5(CH_3)CO)_{3-t}Al$ $(CH_3COCH_2COOC_2H_5)_t$, and the like is preferable as the metal chelate compound.

The metal chelate compound is used in an amount of 0.0001 to 10 parts by weight, and preferably 0.001 to 5 parts by weight for 100 parts by weight of the silane compound selected from the compounds 1 to 3 in total (converted into complete hydrolysis-condensation product) at the time of hydrolysis and condensation. If the amount of the metal chelate compound is less than 0.0001 parts by weight, coating applicability may be decreased. If the amount of the metal chelate compound exceeds 10 parts by weight, the crack resistance of the coating may be decreased. The metal chelate compound may be added in advance to the organic solvent at the time of hydrolysis and condensation together with the silane compound selected from the compounds 1 to 3, or may be dissolved or dispersed in water when adding water.

When subjecting the silane compound selected from the compounds 1 to 3 to hydrolysis and condensation in the presence of the metal chelate compound, it is preferable to add water in an amount of 0.5 to 20 mol, and particularly preferably 1 to 10 mol for one mol of the silane compound selected from the compounds 1 to 3 in total. If the amount of water added is less than 0.5 mol, the crack resistance of the coating may be decreased. If the amount exceeds 20 mol, polymer precipitation or gelation may occur during the hydrolysis and condensation reaction. It is preferable that the water be added intermittently or continuously.

1.1.4b Acidic Compound

As the acidic compound which may be used at the time of hydrolysis and condensation of the silane compound selected from the compounds 1 to 3, organic acids or inorganic acids can be given. As examples of the organic acids, acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linolic acid, linoleic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, tartaric acid, maleic anhydride, fumaric acid, itaconic acid, succinic acid, mesaconic acid, citraconic acid, malic acid, malonic acid, hydrolysate of glutaric acid, hydrolysate of maleic anhydride, hydrolysate of phthalic anhydride, and the like can be given. As examples of the inorganic acids, hydrochloric acid, nitric acid, sulfuric acid, hydrofluoric acid, phosphoric acid, and the like can be given. In particular, the organic acids are preferable since polymer precipitation or gelation rarely occurs during the hydrolysis and condensation reaction. Among the organic acids, a compound including a carboxyl group is still more preferable. In particular, acetic acid, oxalic acid, maleic acid, formic acid, malonic acid, phthalic acid, fumaric acid, itaconic acid, succinic acid, mesaconic acid, citraconic acid, malic acid, glutaric acid, and a hydrolysate of maleic anhydride are preferable. These compounds may be used either individually or in combination of two or more.

The acidic compound is used in an amount of 0.0001 to 10 parts by weight, and preferably 0.001 to 5 parts by weight for 100 parts by weight of the silane compound selected from the compounds 1 to 3 in total (converted into complete hydrolysis-condensation product) at the time of hydrolysis and condensation. If the amount of the acidic compound used is less than 0.0001 parts by weight, coating applicability may be decreased. If the amount of the acidic compound exceeds 10 parts by weight, the crack resistance of the coating may be decreased. The acidic compound may be added in advance to the organic solvent at the time of hydrolysis and condensation together with the silane compound selected from the compounds 1 to 3, or may be dissolved or dispersed in water when adding water.

When subjecting the silane compound selected from the compounds 1 to 3 to hydrolysis and condensation in the presence of the acidic compound, it is preferable to add water in an amount of 0.5 to 20 mol, and particularly preferably 1 to 10 mol for one mol of the silane compound selected from the compounds 1 to 3 in total. If the amount of water added is less than 0.5 mol, the crack resistance of the coating may be decreased. If the amount exceeds 20 mol, polymer precipitation or gelation may occur during the hydrolysis and condensation reaction. It is preferable that the water be added intermittently or continuously.

1.1.4c Basic Compound

As examples of the basic compounds which may be used at the time of hydrolysis and condensation of the silane compound selected from the compounds 1 to 3, sodium hydroxide, potassium hydroxide, lithium hydroxide, cerium hydroxide, barium hydroxide, calcium hydroxide, pyridine, pyrrole, piperazine, pyrrolidine, piperidine, picoline, ammonia, methylamine, ethylamine, propylamine, butylamine, dimethylamine, diethylamine, dipropylamine, dibutylamine, trimethylamine, triethylamine, tripropylamine, tributylamine, monoethanolamine, diethanolamine, dimethylmonoethanolamine, monomethyldiethanolamine, triethanolamine, diazabicyclooctane, diazabicyclononane, diazabicycloundecene, urea, tetramethylammonium hydroxide, tetraethylammonium hydroxide, tetrapropylammonium hydroxide, tetrabutylammonium hydroxide, benzyltrimethylammonium hydroxide, choline, and the like can be given. Of these, ammonia, organic amines, and ammonium hydroxides are preferable, with tetramethylammonium hydroxide, tetraethylammonium hydroxide, and tetrapropylammonium hydroxide being particularly preferable. The basic compound may be used either individually or in combination of two or more.

The amount of the basic compound to be used is usually 0.00001 to 1 mol, and preferably 0.00005 to 0.5 mol for 1 mol of the total amount of the alkoxyl groups in the silane compound selected from the compounds 1 to 3 (groups represented by the $R^1O$— group, $R^2O$— group, $R^4O$— group, and $R^5O$— group). If the amount of the basic compound used is within the above range, polymer precipitation or gelation rarely occurs during the reaction.

When subjecting the silane compound selected from the compounds 1 to 3 to hydrolysis and condensation in the presence of the basic compound, it is preferable to add water in an amount of 0.5 to 150 mol, and particularly preferably 0.5 to 130 mol for one mol of the silane compound selected from the compounds 1 to 3 in total. If the amount of water added is less than 0.5 mol, the crack resistance of the coating may be decreased. If the amount exceeds 150 mol, polymer precipitation or gelation may occur during the hydrolysis and condensation reaction.

In this case, it is preferable to use an alcohol having a boiling point of 100° C. or less together with water. As examples of the alcohol having a boiling point of 100° C. or less used, methanol, ethanol, n-propanol, and isopropanol can be given. The alcohol having a boiling point of 100° C. or less is used in an amount of usually 3 to 100 mol, and preferably 5 to 80 mol for one mol of the silane compound selected from the compounds 1 to 3 in total.

The alcohol having a boiling point of 100° C. or less may be produced during hydrolysis and/or condensation of the silane compound selected from the compounds 1 to 3. In this case, it is preferable to remove the alcohol having a boiling point of 100° C. or less by distillation or the like so that the content becomes 20 wt % or less, and preferably 5 wt % or less. A dehydrating agent such as methyl orthoformate, a metal complex, or a leveling agent may be included as an additive.

After obtaining a hydrolysis-condensation product from the silane compound selected from the compounds 1 to 3 in the presence of the basic compound, it is preferable to adjust the pH of the film-forming composition of the invention to 7 or less. As the pH adjustment method, 1) a method of adding a pH adjustment agent, 2) a method of evaporating the basic compound from the composition under normal pressure or reduced pressure, 3) a method of removing the basic compound from the composition by bubbling a gas such as nitrogen or argon through the composition, 4) a method of removing the basic compound from the composition using an ion-exchange resin, 5) a method of removing the basic compound from the system by extraction or washing, and the like can be given. These methods may be used in combination.

As the pH adjustment agent, inorganic acids and organic acids can be given. As examples of the inorganic acids, hydrochloric acid, nitric acid, sulfuric acid, hydrofluoric acid, phosphoric acid, boric acid, oxalic acid, and the like can be given.

As examples of the organic acids, acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linolic acid, linoleic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, tartaric acid, succinic acid, itaconic acid, mesaconic acid, citraconic acid, malic acid, hydrolysate of glutaric acid, hydrolysate of maleic anhydride, hydrolysate of phthalic anhydride, and the like can be given. These compounds may be used either individually or in combination of two or more.

The pH of the composition is adjusted to 7 or less, and preferably 1 to 6 using the pH adjustment agent. The storage stability of the composition is improved by adjusting the pH within the above range using the pH adjustment agent. The pH adjusting agent is used in such an amount that the pH of the composition is within the above range. The amount of the pH adjusting agent is appropriately selected.

1.1.5 Organic Solvent

In the invention, the silane compound selected from the compounds 1 to 3 may be subjected to hydrolysis and condensation in an organic solvent. The organic solvent is preferably a solvent shown by the following general formula (18):

$$R^{29}O(CHCH_3CH_2O)_\gamma R^{30} \quad (18)$$

wherein $R^{29}$ and $R^{30}$ individually represent a hydrogen atom or an organic group selected from an alkyl group having 1 to 4 carbon atoms and $CH_3CO—$, and $\gamma$ represents an integer of 1 or 2.

In the general formula (18), as examples of the alkyl group having 1 to 4 carbon atoms, the groups given as examples for the general formula (1) can be given.

As specific examples of the organic solvent shown by the general formula (18), propylene glycol monomethyl ether, propylene glycol monoethyl ether, propylene glycol monopropyl ether, propylene glycol monobutyl ether, propylene glycol dimethyl ether, propylene glycol diethyl ether, propylene glycol dipropyl ether, propylene glycol dibutyl ether, dipropylene glycol monomethyl ether, dipropylene glycol monoethyl ether, dipropylene glycol monopropyl ether, dipropylene glycol monobutyl ether, dipropylene glycol dimethyl ether, dipropylene glycol diethyl ether, dipropylene glycol dipropyl ether, dipropylene glycol dibutyl ether, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, dipropylene glycol monopropyl ether acetate, dipropylene glycol monobutyl ether acetate, propylene glycol diacetate, dipropylene glycol diacetate, and the like can be given. Of these, propylene glycol monomethyl ether, propylene glycol monoethyl ether, propylene glycol monopropyl ether, propylene glycol monobutyl ether, propylene glycol dimethyl ether, propylene glycol diethyl ether, propylene glycol monomethyl ether acetate, propylene glycol monoethyl ether acetate, and propylene glycol monopropyl ether acetate are preferable. These compounds may be used either individually or in combination of two or more. Another solvent such as an ester solvent and an amide solvent may be included in a small amount together with the solvent shown by the general formula (18).

The total solid content of the film-forming composition of the invention is appropriately adjusted depending on the target application, preferably in the range of 1 to 30 wt %. If the total solid content of the film-forming composition of the invention is 1 to 30 wt %, the resulting coating has a thickness within an appropriate range, and the composition exhibits a more excellent storage stability. The total solid content is adjusted by concentration or dilution with an organic solvent, if necessary.

The film-forming composition of the invention may include the following organic solvent in an amount of 50 wt % or less of the solvent. As examples of the organic solvent used in the invention, aliphatic hydrocarbon solvents such as n-pentane, isopentane, n-hexane, isohexane, n-heptane, isoheptane, 2,2,4-trimethylpentane, n-octane, isooctane, cyclohexane, and methylcyclohexane; aromatic hydrocarbon solvents such as benzene, toluene, xylene, ethylbenzene, trimethylbenzene, methylethylbenzene, n-propylebenzene, isopropylebenzene, diethylbenzene, isobutylbenzene, triethylbenzene, diisopropylbenzene, n-amylnaphthalene, and trimethylbenzene; ketone solvents such as acetone, methyl ethyl ketone, methyl n-propyl ketone, methyl n-butyl ketone, diethyl ketone, methyl isobutyl ketone, methyl n-pentyl ketone, ethyl n-butyl ketone, methyl n-hexyl ketone, diisobutyl ketone, trimethylnonanone, cyclohexanone, 2-hexanone, methylcyclohexanone, 2,4-pentanedione, acetonylacetone, diacetone alcohol, acetophenone, and fenchone; ether solvents such as ethyl ether, isopropyl ether, n-butyl ether, n-hexyl ether, 2-ethylhexyl ether, dioxolane, 4-methyl dioxolane, dioxane, dimethyl dioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethyl butyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, tripropylene glycol monomethyl ether, tetrahydrofuran, and 2-methyltetrahydrofuran; ester solvents such as diethyl carbonate, methyl acetate, ethyl acetate, γ-butyrolactone, γ-valerolactone, n-propyl acetate, isopropyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, methoxy triglycol acetate, ethyl propionate, n-butylpropionate, isoamyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents such as N-methylformamide, N,N-dimethylformamide, N,N-diethylformamide, acetamide, N-methylacetamide, N,N-dimethylacetamide, N-methylpropioneamide, and N-methylpyrrolidone; sulfur-containing solvents such as dimethyl sulfide, diethyl sulfide, thiophene, tetrahydrothiophene, dimethylsulfoxide, sulfolane, and 1,3-propanesultone; and the like can be given. These solvents may be used either individually or in combination of two or more.

The film-forming composition of the present invention may further include components such as colloidal silica, colloidal alumina, organic polymer, surfactant, silane coupling agent, radical generator, and triazene compound. Colloidal silica is a dispersion liquid in which high-purity silicic anhydride is dissolved in a hydrophilic organic solvent, and generally has an average particle size of 5 to 30 μm, and preferably 10 to 20 μm, and a solid content of about 10 to 40 wt %. Such colloidal silica is commercially available as methanol silica sol or isopropanol silica sol (manufactured by Nissan Chemical Industries, Ltd.), Oscal (manufactured by Catalysts & Chemicals Ind. Co., Ltd.), and the like. The colloidal alumina is commercially available as Alumina Sol 520, Alumina Sol 100, Alumina Sol 200 (manufactured by Nissan Chemical industries, Ltd.), Alumina Clear Sol, Alumina Sol 10, Alumina Sol 132 (manufactured by Kawaken Fine Chemicals Co., Ltd.), and the like. As examples of the organic polymers, compounds with a sugar chain structure, vinyl amide polymers, (meth)acrylic polymers, aromatic vinyl compounds, dendolimers, polyimides, polyamic acids, polyarylenes, polyamides, polyquinoxalines, polyoxadizoles, fluorine-containing polymers, compounds with a polyalkylene oxide structure, and the like can be given.

As the polyalkylene oxide structure, a polymethylene oxide structure, a polyethylene oxide structure, polypropylene oxide structure, polytetramethylene oxide structure, polybutylene oxide structure, and the like can be given. As specific examples of the compound having a polyalkylene oxide structure, ether compounds such as polyoxymethylene alkyl ether, polyoxyethylene alkyl ether, polyoxyethylene alkylphenyl ether, polyoxyethylene sterol ether, polyoxyethylene lanolin derivatives, ethylene oxide derivatives of alkylphenol formalin condensate, polyoxyethylene polyoxypropylene block copolymers, and polyoxyethylene polyoxypropylene alkyl ethers; ether-ester compounds such as polyoxyethylene glyceride, polyoxyethylene sorbitan fatty acid ester, polyoxyethylene sorbitol fatty acid ester, and polyoxyethylene fatty acid alkanolamide sulfate; and ester compounds such as polyethylene glycol fatty acid ester, ethylene glycol fatty acid ester, fatty acid monoglyceride, polyglycerol fatty acid ester, sorbitan fatty acid ester, propylene glycol fatty acid ester, and sucrose fatty acid ester, and the like can be given. As the polyoxyethylene polyoxypropylene block copolymer, compounds having the following block structure can be given:

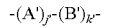

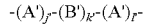

wherein A' represents a group —CH$_2$CH$_2$O—, B' represents a group —CH$_2$CH(CH$_3$)O—, j' is a number of 1 to 90, k' is a number of 10 to 90, and l' is a number of 0 to 90.

Of these, ether-type compounds such as polyoxyethylene alkyl ethers, polyoxyethylene polyoxypropylene block copolymers, polyoxyethylene polyoxypropylene alkyl ethers, polyoxyethylene glycerides, polyoxyethylene sorbitan fatty acid esters, polyoxyethylene sorbitol fatty acid esters, and the like are preferable. These compounds may be used either individually or in combination of two or more.

As examples of surfactants, nonionic surfactants, anionic surfactants, cationic surfactants, and amphoteric surfactants can be given. These may be a fluorine-containing surfactant, silicon-containing surfactant, polyalkylene oxide surfactant, poly(meth)acrylate surfactant, or the like. Of these, fluorine-containing surfactants and silicone surfactants are preferable.

As examples of fluorine-containing surfactants, compounds having a fluoroalkyl or fluoroalkylene group in at least one of the molecular terminal, the main chain, or the side chain, such as 1,1,2,2-tetrafluorooctyl(1,1,2,2-tetrafluoropropyl)ether, 1,1,2,2-tetrafluorooctylhexyl ether, octaethylene glycol di(1,1,2,2-tetrafluorobutyl)ether, hexaethylene glycol (1,1,2,2,3,3-hexafluoropentyl)ether, octapropylene glycol di(1,1,2,2-tetrafluorobutyl)ether, hexapropylene glycol di(1,1,2,2,3,3-hexafluoropentyl) ether, sodium perfluorododecyl sulfonate, 1,1,2,2,8,8,9,9,10,10-decafluorododecane, 1,1,2,2,3,3-hexafluorodecane, N-[3-(perfluorooctanesulfonamide)-propyl]-N,N'-dimethyl-N-carboxymethyleneammonium betaine, perfluoroalkylsulfonamidepropyltrimethylammonium salt, perfluoroalkyl-N-ethylsulfonylglycine salt, bis(N-perfluorooctylsulfonyl-N-ethylaminoethyl)phosphate, and monoperfluoroalkylethyl phosphate can be given. As examples of commercially available products of fluorine-containing surfactants, Megafac F142D, F172, F173, F183 (manufactured by Dainippon Ink and Chemicals, Inc.), Eftop EF301, EF303, EF352 (manufactured by Shin-Akita Kasei Co., Ltd.). Fluorad FC-430, FC-431 (manufactured by Sumitomo 3M Co., Ltd.), Asahi Guard AG710, Surflon S-382, SC-101, SC-102, SC-103, SC-104, SC-105, SC-106 (manufactured by Asahi Glass Co., Ltd.), BM-1000, BM-1100 (manufactured by BM Chemie), and NBX-15 (manufactured by NEOS Co., Ltd.) can be given. Of these, Megafac F172, BM-1000, BM-1100, and NBX-15 are particularly preferable.

As silicone surfactants, SH7PA, SH21PA, SH30PA, ST94PA (manufactured by Toray-Dow Corning Silicone Co., Ltd.), and the like may be used. Of these, a polymer shown by the following general formula (19), which corresponds to SH28PA and SH30PA, is particularly preferable:

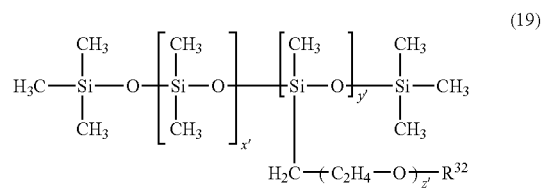

wherein R$^{32}$ represents a hydrogen atom or an alkyl group having 1 to 5 carbon atoms, z' represents an integer from 1 to 20, and x' and y' individually represent integers from 2 to 100.

The amount of the surfactant to be used is usually 0.0001 to 10 parts by weight for 100 parts by weight of the total amount of the silane compound selected from the compounds 1 to 3 (converted into complete hydrolysis-condensation product). The surfactant may be used either individually or in combination of two or more.

As examples of the silane coupling agent, 3-glycidyloxypropyltrimethoxysilane, 3-aminoglycidyloxypropyltriethoxysilane, 3-methacryloxypropyltrimethoxysilane, 3-glycidyloxypropylmethyldimethoxysilane, 1-methacryloxypropylmethyldimethoxysilane, 3-aminopropyltrimethoxysilane, 3-aminopropyltriethoxysilane, 2-aminopropyltrimethoxysilane, 2-aminopropyltriethoxysilane, N-(2-aminoethyl)-3-aminopropyltrimethoxysilane, N-(2-aminoethyl)-3-aminopropylmethyldimethoxysilane, 3-ureidopropyltrimethoxysilane, 3-ureidopropyltriethoxysilane, N-ethoxycarbonyl-3-aminopropyltrimethoxysilane, N-ethoxycarbonyl-3-aminopropyltriethoxysilane, N-triethoxysilylpropyltriethylenetriamine, N-triethoxysilylpropyltriethylenetriamine, 10-trimethoxysilyl-1,4,7-triazadecane, 10-triethoxysilyl-1,4,7-triazadecane, 9-trimethoxysilyl-3,6-diazanonylacetate, 9-triethoxysilyl-3, 6-diazanonylacetate, N-benzyl-3-aminopropyltrimethoxysilane, N-benzyl-3-aminopropyltriethoxysilane, N-phenyl-3-aminopropyltrimethoxysilane, N-phenyl-3- aminopropyltriethoxysilane, N-bis(oxyethylene)-3-aminopropyltrimethoxysilane, N-bis(oxyethylene)-3-aminopropyltriethoxysilane, and the like can be given. These compounds may be used either individually or in combination of two or more.

The film-forming composition of the invention contains the alcohol having a boiling point of 100° C. or less in an amount of preferably 20 wt % or less, and particularly preferably 5 wt % or less. An alcohol having a boiling point of 100° C. or less may be produced when a component (A) and a component (B) are hydrolyzed and/or condensed. It is preferable to remove such an alcohol by distillation or the like so that the content is 20 wt % or less, and preferably 5 wt % or less. A dehydrating agent such as methyl orthoformate, a metal complex, or a leveling agent may be included as an additive.

1.2 Second Silica-based Film

The second silica-based film is a film obtained by forming a coating by using a film-forming composition which includes a hydrolysis-condensation product obtained by hydrolysis and condensation of a silane compound as a component (A) and a silane compound as a component (B) in the presence of an acidic, basic, or metal chelate compound, and the curing the resulting coating. In the laminate of the invention, adhesion between the organic film and the first silica-based film can be improved by providing the second silica-based film between the first silica-based film and the organic film.

1.2.1 Component (A)

As the silane compound as the component (A) used to form the second silica-based film, at least one silane compound selected from compounds shown by the following general formula (1) (compound 1), compounds shown by the following general formula (2) (compound 2), and compounds shown by the following general formula (3) (compound 3) can be given:

$$R_a Si(OR^1)_{4-a} \quad (1)$$

wherein R represents a hydrogen atom, a fluorine atom, or an organic group, $R^1$ represents an organic group, and a represents an integer of 1 or 2, $$Si(OR^2)_4 \quad (2)$$

wherein $R^2$ represents an organic group, $$R^3{}_b(R^4O)_{3-b}Si\text{—}(R^7)_d\text{—}Si(OR^5)_{3-c}R^6{}_c \quad (3)$$

wherein $R^3$ to $R^6$ individually represent organic groups, b and c individually represent integers from 0 to 2, $R^7$ represents an oxygen atom, a phenylene group, or a group —(CH$_2$)$_m$— (wherein m represents an integer from 1 to 6), and d represents 0 or 1.

As the compounds 1 to 3, compounds similar to the compounds 1 to 3 used to form the first silica-based film can be given.

1.2.2 Component (B)

As the silane compound as the component (B) used to form the second silica-based film, at least one silane compound selected from compounds shown by the following general formula (4) (compound 4) and compounds shown by the following general formula (5) (compound 5) may be used:

wherein $R_x$ represents an organic group containing a carbon-carbon double bond or a carbon-carbon triple bond, and $R^{31}$ to $R^{83}$ individually represent a hydrogen atom, a halogen atom, a hydroxyl group, an alkoxyl group, or an organic group, provided that at least one of $R^{81}$ to $R^{83}$ represents an atom or a group other than the organic group, wherein, in the general formula (4), as the organic group containing a carbon-carbon double bond or a carbon-carbon triple bond, a vinyl group, ethynyl group, allyl group, phenylethynyl group, ethynylphenyl group, and the like can be given; and

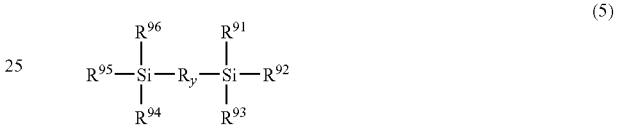

wherein $R_y$ represents a divalent organic group containing a carbon-carbon double bond or a carbon-carbon triple bond, and $R^{91}$ to $R^{96}$ individually represent a hydrogen atom, a halogen atom, a hydroxyl group, an alkoxyl group, or an organic group, provided that at least one of $R^{91}$ to $R^{93}$ and at least one of $R^{94}$ to $R^{96}$ represent an atom or a group other than the organic group.

In the general formula (5), $R_y$ may be at least one organic group selected from the following organic groups, for example:

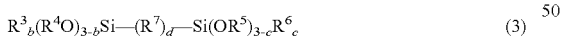

1.2.2a Compound 4

As specific examples of the compound 4, vinyltrimethoxysilane, vinyltriethoxysilane, vinyltri-n-propoxysilane, vinyltriisopropoxysilane, vinyltri-n-butoxysilane, vinyltri-sec-butoxysilane, vinyltri-tert-butoxysilane, vinyltriphenoxysilane, ethynyltrimethoxysilane, ethynyltriethoxysilane, ethynyltri-n-propoxysilane, ethynyltriisopropoxysilane, ethynyltri-n-butoxysilane, ethynyltri-sec-butoxysilane, ethynyltri-tert-butoxysilane, ethynyltriphenoxysilane, vinylchlorosilane, vinyldichlorosilane, vinyltrichlorosilane, vinylmethoxysilane, vinyldimethoxysilane, vinylethoxysilane, vinyldiethoxysilane, vinyldichloromethylsilane, vinylchlorodimethylsilane, vinyldimethylmethoxysilane, vinylmethyldimethoxysilane, vinyldimethylethoxysilane, vinylmethyldiethoxysilane, vinyldimethylhydroxysilane, ethynylchlorosilane, ethynyldichlorosilane, ethynyltrichlorosilane, ethynylmethoxysilane, ethynyldimethoxysilane, ethynylethoxysilane, ethynyldiethoxysilane, ethynyldichloromethylsilane, ethynylchlorodimethylsilane, ethynyldimethylmethoxysilane, ethynylmethyldimethoxysilane, ethynyldimethylethoxysilane, ethynylmethyldiethoxysilane, ethynyldimethylhydroxysilane, divinyldimethoxysilane, divinyldiethoxysilane, divinyldipropoxysilane, divinyldichlorosilane, diethynyldimethoxysilane, diethynyldiethoxysilane, diethynyldipropoxysilane, diethynyldichlorosilane, trivinylmethoxysilane, trivinylethoxysilane, trivinylpropoxysilane, trivinylchlorosilane, triethynylmethoxysilane, triethynylethoxysilane, triethynylpropoxysilane, triethynylchlorosilane, and the like can be given. Of these, vinyltrimethoxysilane, vinyltriethoxysilane, vinyltri-n-propoxysilane, vinyltriisopropoxysilane, vinyldimethylmethoxysilane, vinylmethyldimethoxysilane, divinyldimethoxysilane, divinyldiethoxysilane, ethynyltrimethoxysilane, ethynyltriethoxysilane, ethynyltri-n-propoxysilane, ethynyltriisopropoxysilane, ethynyltri-n-propoxysilane, ethynyldimethylmethoxysilane, ethynylmethyldimethoxysilane, diethynyldimethoxysilane, and diethynyldiethoxysilane are preferable. These compounds may be used either individually or in combination of two or more.

1.2.2b Compound 5

As specific examples of the compound 5, bis(trimethoxysilyl)ethylene, bis(triethoxysilyl)ethylene, bis(tri-n-propoxysilyl)ethylene, bis(triisopropoxysilyl)ethylene, bis(trichlorosilyl)ethylene, bis(dimethylmethoxysilyl)ethylene, bis(dimethylethoxysilyl)ethylene, bis(dimethylchlorosilyl)ethylene, bis(dimethylhydroxysilyl)ethylene, bis(trimethoxysilyl)acetylene, bis(triethoxysilyl)acetylene, bis(tri-n-propoxysilyl)acetylene, bis(triisopropoxysilyl)acetylene, bis(trichlorosilyl)acetylene, bis(dimethylmethoxysilyl)acetylene, bis(dimethylethoxysilyl)acetylene, bis(dimethylchlorosilyl)acetylene, bis(dimethylhydroxysilyl)acetylene, 1,2-bis[(trimethoxysilyl)vinyl]benzene, 1,3-bis[(trimethoxysilyl)vinyl]benzene, 1,4-bis[(trimethoxysilyl)vinyl]benzene, 1,2-bis[(trimethoxysilyl)ethynyl]benzene, 1,3-bis[(trimethoxysilyl)ethynyl]benzene, 1,4-bis[(trimethoxysilyl)ethynyl]benzene, 1,2-bis[(triethoxysilyl)vinyl]benzene, 1,3-bis[(triethoxysilyl)vinyl]benzene, 1,4-bis[(triethoxysilyl)vinyl]benzene, 1,2-bis[(triethoxysilyl)ethynyl]benzene, 1,3-bis[(triethoxysilyl)ethynyl]benzene, 1,4-bis[(triethoxysilyl)ethynyl]benzene, 1,2-bis[(trichlorosilyl)vinyl]benzene, 1,3-bis[(trichlorosilyl)vinyl]benzene, 1,4-bis[(trichlorosilyl)vinyl]benzene, 1,2-bis[(trichlorosilyl)ethynyl]benzene, 1,3-bis[(trichlorosilyl)ethynyl]benzene, 1,4-bis[(trichlorosilyl)ethynyl]benzene, 1,2-bis[(chlorodimethylsilyl)vinyl]benzene, 1,3-bis[(chlorodimethylsilyl)vinyl]benzene, 1,4-bis[(chlorodimethylsilyl)vinyl]benzene, 1,2-bis[(chlorodimethylsilyl)ethynyl]benzene, 1,3-bis[(chlorodimethylsilyl)ethynyl]benzene, 1,4-bis[(chlorodimethylsilyl)ethynyl]benzene, 1,2-bis[(methoxydimethylsilyl)vinyl]benzene, 1,3-bis[(methoxydimethylsilyl)vinyl]benzene, 1,4-bis[(methoxydimethylsilyl)vinyl]benzene, 1,2-bis[(methoxydimethylsilyl)ethynyl]benzene, 1,3-bis[(methoxydimethylsilyl)ethynyl]benzene, 1,4-bis[(methoxydimethylsilyl)ethynyl]benzene, and the like can be given. Of these, bis(trimethoxysilyl)ethylene, bis(triethoxysilyl)ethylene, bis(dimethoxysilyl)ethylene, bis(trimethoxysilyl)acetylene, bis(triethoxysilyl)acetylene, bis(dimethylmethoxysilyl)acetylene, 1,2-bis[(trimethoxysilyl)vinyl]benzene, 1,3-bis[(trimethoxysilyl)vinyl]benzene, 1,4-bis[(trimethoxysilyl)vinyl]benzene, 1,2-bis[(trimethoxysilyl)ethynyl]benzene, 1,3-bis[(trimethoxysilyl)ethynyl]benzene, and 1,4-bis[(trimethoxysilyl)ethynyl]benzene are preferable. These compounds may be used either individually or in combination of two or more.

The amount of the component (B) to be used is preferably 1 to 100 parts by weight, and still more preferably 2 to 25 parts by weight for 100 parts by weight of the component (A) (converted into complete hydrolysis-condensation product). If the amount of the component (B) to be used is less than 1 part by weight for 100 parts by weight of the component (A) (converted into complete hydrolysis-condensation product), sufficient adhesion cannot be obtained. If the amount exceeds 100 parts by weight, applicability deteriorates at the time of application, whereby it becomes difficult to maintain CD uniformity of the coating. The amount of the component (A) used herein is the amount when converted into the complete hydrolysis-condensation product.

The concentration of the total amount of the component (A) and the component (B) at the time of hydrolysis and condensation is preferably 0.1 to 30 wt %, and still more preferably 1 to 10 wt %. If the concentration is less than 0.1 wt %, the condensation reaction may not sufficiently proceed, whereby a coating liquid may not be obtained. If the concentration exceeds 30 wt %, precipitation or gelling of polymers may occur during the reaction. The concentration of the component (A) and the component (B) is the concentration when the component (A) and the component (B) are converted into the complete hydrolysis-condensation product.

1.2.3 Others

The hydrolysis-condensation product included in the film-forming composition (II) may be formed in the presence of at least one of a metal chelate compound, an acidic compound, and a basic compound. As the metal chelate compound, acidic compound, and basic compound, compounds similar to the compounds used to form the first silica-based film may be used.

When using the metal chelate compound, the amount of the metal chelate compound to be used is 0.0001 to 10 parts by weight, and preferably 0.001 to 5 parts by weight for 100 parts by weight of the total amount of the component (A) and the component (B) (converted into complete hydrolysis-condensation product) at the time of hydrolysis and condensation. If the amount of the metal chelate compound is less than 0.0001 parts by weight, coating applicability may be decreased. If the amount of the metal chelate compound exceeds 10 parts by weight, the crack resistance of the coating may be decreased. The metal chelate compound may be added in advance to an organic solvent together with the component (A) and the component (B) at the time of hydrolysis and condensation, or may be dissolved or dispersed in water when adding water.

When subjecting the component (A) and the component (B) to hydrolysis and condensation in the presence of the metal chelate compound, it is preferable to use water in an amount of 0.5 to 20 mol, and particularly preferably 1 to 10 mol for one mol of the total amount of the component (A) and the component (B). If the amount of water added is less than 0.5 mol, the crack resistance of the coating may be decreased. If the amount exceeds 20 mol, polymer precipitation or gelation may occur during the hydrolysis and condensation reaction. It is preferable that the water be added intermittently or continuously.

When using the acidic compound, the amount of the acidic compound to be used is 0.0001 to 10 parts by weight, and preferably 0.001 to 5 parts by weight for 100 parts by weight of the total amount of the component (A) and the component (B) (converted into complete hydrolysis-condensation product) at the time of hydrolysis and condensation. If the amount of the acidic compound used is less than 0.0001 parts by weight, coating applicability may be decreased. If the amount of the acidic compound exceeds 10 parts by weight, the crack resistance of the coating may be decreased. The acidic compound may be added in advance to an organic solvent together with the component (A) and the component (B) at the time of hydrolysis and condensation, or may be dissolved or dispersed in water when adding water.

When subjecting the component (A) and the component (B) to hydrolysis and condensation in the presence of the acidic compound, it is preferable to use water in an amount of 0.5 to 20 mol, and particularly preferably 1 to 10 mol for one mol of the total amount of the component (A) and the component (B). If the amount of water added is less than 0.5 mol, the crack resistance of the coating may be decreased. If the amount exceeds 20 mol, polymer precipitation or gelation may occur during the hydrolysis and condensation reaction. It is preferable that the water be added intermittently or continuously.

When using the basic compound, the amount of the basic compound to be used is usually 0.00001 to 1 mol, and preferably 0.00005 to 0.5 mol for 1 mol of the total amount of the alkoxyl groups in the component (A) (groups represented by the $R^1O$— group, $R^2O$— group, $R^4O$— group, and $R^5O$— group) and the component (B). If the amount of the basic compound used is within the above range, polymer precipitation or gelation rarely occurs during the reaction.

When subjecting the component (A) and the component (B) to hydrolysis and condensation in the presence of the basic compound, it is preferable to use water in an amount of 0.5 to 150 mol, and particularly preferably 0.5 to 130 mol for one mol of the total amount of the component (A) and the component (B). If the amount of water added is less than 0.5 mol, the crack resistance of the coating may be decreased. If the amount exceeds 150 mol, polymer precipitation or gelation may occur during the hydrolysis and condensation reaction.

The film-forming composition (II) may include an organic solvent. As the organic solvent which may be used, an organic solvent similar to the organic solvent used to form the first silica-based film may be used. The film-forming composition (II) may further include colloidal silica, colloidal alumina, organic polymer, surfactant, silane coupling agent, and the like used to form the first silica-based film as other additives.

1.3 Organic Film

In the laminate of the invention, the organic film is a film obtained by curing a coating obtained by applying a film-forming composition (III) including at least one compound selected from polyarylene, polyarylene ether, polybenzoxazole, and polyimide and removing a solvent from the applied composition. In more detail, the film-forming composition (III) includes a polymer including at least one repeating unit selected from the following general formulas (6) to (9).

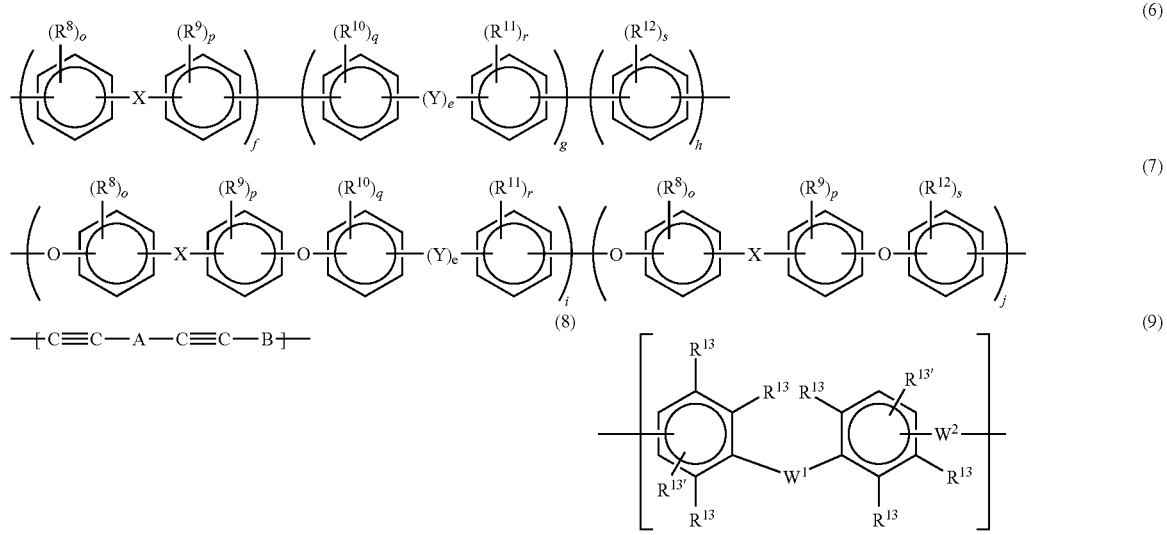

In the above general formulas (6) to (9), $R^8$ to $R^{12}$ individually represent a hydrocarbon group having 1 to 20 carbon atoms, a cyano group, a nitro group, an alkoxyl group having 1 to 20 carbon atoms, or a halogen atom, X represents at least one group selected from the group consisting of a group shown by —CQQ'— (wherein Q and Q' individually represent an alkyl halide group, an alkyl group, a hydrogen atom, a halogen atom, or an aryl group) and a fluorenylene group, Y represents at least one group selected from the group consisting of —O—, —CO—, —COO—, —CONH—, —S—, —SO$_2$—, and a phenylene group, e represents 0 or 1, o to s individually represent integers from 0 to 4, f is 5 to 100 mol %, g is 0 to 95 mol %, h is 0 to 95 mol % (provided that f+g+h=100 mol %), i is 0 to 100 mol %, and j is 0 to 100 mol % (provided that i+j=100 mol %); A and B individually represent at least one group selected from the group consisting of divalent aromatic groups shown by the following general formulas (10) to (12); $R^{13}$ and $R^{13'}$ individually represent a hydrogen atom or at least one group selected from the group consisting of aromatic groups shown by the following general formulas (13) and (14); and $W^1$ and $W^2$ represent at least one group selected from the group consisting of divalent aromatic group shown by the following general formulas (15) and (16).

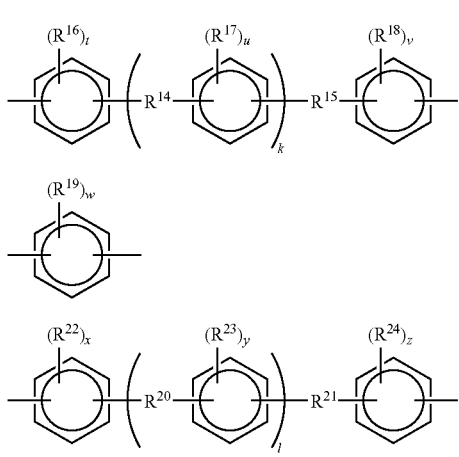

In the above general formulas (10) to (12), $R^{14}$, $R^{15}$, $R^{20}$, and $R^{21}$ individually represent a single bond, —O—, —CO—, —CH$_2$—, —COO—, —CONH—, —S—, —SO$_2$—, phenylene group, isopropylidene group, hexafluoroisopropylidene group, diphenylmethylidene group, fluorenylene group, or group shown by the following formula,

$R^{16}$ to $R^{19}$ and $R^{22}$ to $R^{24}$ individually represent a hydrocarbon group having 1 to 20 carbon atoms, a cyano group, a nitro group, an alkoxyl group having 1 to 20 carbon atoms, or an aryl group, k represents an integer from 0 to 3, l represents an integer from 2 to 3, and t to z individually represent integers from 0 to 4.

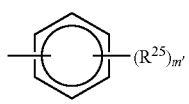

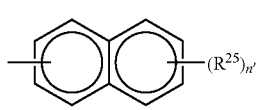

In the above general formulas (13) and (14), $R^{25}$ represents a halogen atom, a hydrocarbon group having 1 to 20 carbon atoms, an alkyl halide group, an alkoxyl groups having 1 to 20 carbon atoms, a phenoxy group, or an aryl group, m' represents an integer from 0 to 5, and n' represents an integer from 0 to 7.

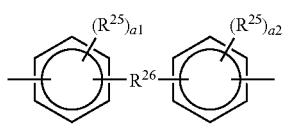

In the above general formulas (15) and (16), $R^{25}$ represents a halogen atom, a hydrocarbon group having 1 to 20 carbon atoms, an alkyl halide group, an alkoxyl group having 1 to 20 carbon atoms, a phenoxy group, or an aryl group, $R^{26}$ represents a single bond, —O—, —CO—, —CH$_2$—, —COO—, —CONH—, —S—, —SO$_2$—, phenylene group, isopropylidene group, hexafluoroisopropylidene group, diphenylmethylidene group, methylphenylmethylidene group, trifluoromethylmethylmethylidene group, trifluoromethylphenylmethylidene group, fluorenylene group, or group shown by the following formula,

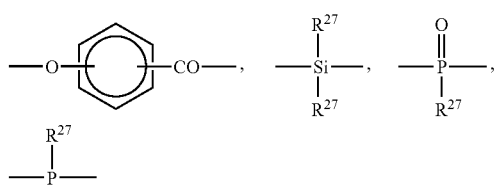

(wherein $R^{27}$ individually represents a hydrogen atom, a hydrocarbon group having 1 to 4 carbon atoms, or a phenyl group), a1 and a2 individually represent integers from 0 to 4, and a3 represents an integer from 0 to 6.

The details of the compounds shown by the general formulas (6) to (9) are described below.

1.3.1 Compound 6

The polymer shown by the general formula (6) (hereinafter may be called "compound 6") may be produced by polymerizing a compound shown by the following general formula (20) as a monomer in the presence of a catalyst system containing a transition metal compound:

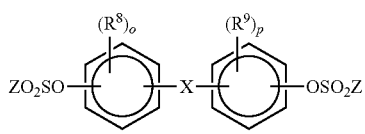

wherein $R^8$ and $R^9$ individually represent a hydrocarbon group having 1-20 carbon atoms, a cyano group, a nitro group, an alkoxyl group having 1-20 carbon atoms, an aryl group, or a halogen atom, X represents at least one group selected from a group shown by —CQQ'— (wherein Q and Q' individually represent an alkyl halide group, an alkyl group, a hydrogen atom, a halogen atom, or an aryl group) and a fluorenylene group, o and p represent integers from 0 to 4, and Z represents an alkyl group, an alkyl halide group, or an aryl group.

As Q and Q' making up X in the general formula (20), a methyl group, ethyl group, isopropyl group, n-propyl group, butyl group, pentyl group, hexyl group, and the like can be given as the alkyl group; a trifluoromethyl group, pentafluoroethyl group, and the like can be given as the alkyl halide group; a benzyl group, diphenylmethyl group, and the like can be given as the arylalkyl group; a phenyl group, biphenyl group, tolyl group, pentafluorophenyl group, and the like can be given as the aryl group.

As Z making up —OSO$_2$Z in the general formula (20), a methyl group, ethyl group, and the like can be given as the alkyl group; a trifluoromethyl group, pentafluoroethyl group, and the like can be given as the alkyl halide group; a phenyl group, biphenyl group, p-tolyl group, p-pentafluorophenyl group, and the like can be given as the aryl group. As X in the general formula (20), divalent groups shown by the following formulas (21) to (26) are preferable. Of these divalent groups, a fluorenylene group shown by the general formula (26) is still more preferable.

 (21)

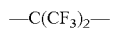 (22)

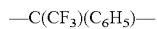 (23)

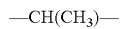 (24)

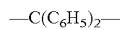 (25)

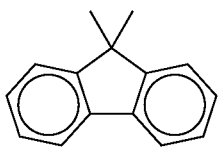 (26)

As specific examples of the compound (monomer) shown by the general formula (20), 2,2-bis(4-methylsulfonyloxyphenyl)hexafluoropropane, bis(4-methylsulfonyloxyphenyl)methane, bis(4-methylsulfonyloxyphenyl)diphenylmethane, 2,2-bis(4-methylsulfonyloxy.3-methylphenyl)hexafluoropropane, 2,2-bis(4-methylsulfonyloxy-3-propenylphenyl)hexafluoropropane, 2,2-bis(4-methylsulfonyloxy-3,5-dimethylphenyl)hexafluoropropane, 2,2-bis(4-methylsulfonyloxyphenyl)propane, 2,2-bis(4-methylsulfonyloxy-3-methylphenyl)propane, 2,2-bis(4-methylsulfonyloxy-3-propenylphenyl)propane, 2,2-bis(4-methylsulfonyloxy-3,5-dimethylphenyl)propane, 2,2-bis(4-methylsulfonyloxy-3-fluorophenyl)propane, 2,2-bis(4-methylsulfonyloxy-3,5-difluorophenyl)propane, 2,2-bis(4-trifluoromethylsulfonyloxyphenyl)propane, 2,2-bis(4-trifluoromethylsulfonyloxy-3-propenylphenyl)propane, 2,2-bis(4-phenylsulfonyloxyphenyl)propane, 2,2-bis(4-phenylsulfonyloxy-3-methylphenyl)propane, 2,2-bis(4-phenylsulfonyloxy-3-propenylphenyl)propane, 2,2-bis(4-phenylsulfonyloxy-3,5-dimethylphenyl)propane, 2,2-bis(4-phenylsulfonyloxy-3-fluorophenyl)diphenylmethane, 2,2-bis(p-tolylsulfonyloxyphenyl)propane, 2,2-bis(p-tolylsulfonyloxyphenyl)propane, 2,2-bis(p-tolylsulfonyloxy-3-propenylphenyl)propane, 2,2-bis(p-tolylsulfonyloxy-3,5-dimethylphenyl)propane, 2,2-bis(p-tolylsulfonyloxy-3-methylphenyl)propane, bis(p-tolylsulfonyloxy-3-fluorophenyl)propane, bis(p-tolylsulfonyloxy-3,5-difluorophenyl)propane, 9,9-bis(4-methylsulfonyloxyphenyl)fluorene, 9,9-bis(4-methylsulfonyloxy-3-methylphenyl)fluorene, 9,9-bis(4-methylsulfonyloxy-3,5-dimethylphenyl)fluorene, 9,9-bis(4-methylsulfonyloxy-3-propenylphenyl)fluorene, 9,9-bis(4-methylsulfonyloxy-3-phenylphenyl)fluorene, bis(4-methylsulfonyloxy-3-methylphenyl)diphenylmethane, bis(4-methylsulfonyloxy-3,5-dimethylphenyl)diphenylmethane, bis(4-methyl sulfonyloxy-3-propenylphenyl)diphenylmethane, bis(4-methylsulfonyloxy-3-fluorophenyl)diphenylmethane, bis(4-methylsulfonyloxy-3,5-difluorophenyl)diphenylmethane, 9,9-bis(4-methylsulfonyloxy-3-fluorophenyl)fluorene, 9,9-bis(4-methylsulfonyloxy-3,5-difluorophenyl)fluorene, bis(4-methylsulfonyloxyphenyl)methane, bis(4-methylsulfonyloxy-3-methylphenyl)methane, bis(4-methylsulfonyloxy-3,5-dimethylphenyl)methane, bis(4-methylsulfonyloxy-3-propenylphenyl)methane, bis(4-methylsulfonyloxyphenyl)trifluoromethylphenylmethane, bis(4-methylsulfonyloxyphenyl)phenylmethane, 2,2-bis(4-trifluoromethylsulfonyloxyphenyl)hexafluoropropane, bis(4-trifluoromethylsulfonyloxyphenyl)methane, bis(4-trifluoromethylsulfonyloxyphenyl)diphenylmethane, 2,2-bis(4-trifluoromethylsulfonyloxy-3-methylphenyl)hexafluoropropane, 2,2-bis(4-trifluoromethylsulfonyloxy-3-propenylphenyl)hexafluoropropane, 2,2-bis(4-trifluoromethylsulfonyloxy-3,5-dimethylphenyl)hexafluoropropane, 9,9-bis(4-trifluoromethylsulfonyloxyphenyl)fluorene, 9,9-bis(4-trifluoromethylsulfonyloxy-3-methylphenyl)fluorene, 9,9-bis(4-trifluoromethylsulfonyloxy-3,5-dimethylphenyl)fluorene, 9,9-bis(4-trifluoromethylsulfonyloxy-3-propenylphenyl)fluorene, 9,9-bis(4-trifluoromethylsulfonyloxy-3-phenylphenyl)fluorene, bis(4-trifluoromethylsulfonyloxy-3-methylphenyl)diphenylmethane, bis(4-trifluoromethylsulfonyloxy-3,5-dimethylphenyl)diphenylmethane, bis(4-trifluoromethylsulfonyloxy-3-propenylphenyl)diphenylmethane, bis(4-trifluoromethylsulfonyloxy-3-fluorophenyl)diphenylmethane, bis(4-trifluoromethylsulfonyloxy-3,5-difluorophenyl)diphenylmethane, 9,9-bis(4-trifluoromethylsulfonyloxy-3-fluorophenyl)fluorene, 9,9-bis(4-trifluoromethylsulfonyloxy-3,5-difluorophenyl)fluorene, bis(4-trifluoromethylsulfonyloxyphenyl)methane, bis(4-trifluoromethylsulfonyloxy-3-methylphenyl)methane, bis(4-trifluoromethylsulfonyloxy-3,5-dimethylphenyl)methane, bis(4-trifluoromethylsulfonyloxy-3-propenylphenyl)methane, bis(4-trifluoromethylsulfonyloxyphenyl)trifluoromethylphenylmethane, bis(4-trifluoromethylsulfonyloxyphenyl), 2,2-bis(4-phenylsulfonyloxyphenyl)hexafluoropropane, bis(4-phenylsulfonyloxyphenyl)methane, bis(4-phenylsulfonyloxyphenyl)diphenylmethane, 2,2-bis(4-phenylsulfonyloxy-3-methylphenyl)hexafluoropropane, 2,2-bis(4-phenylsulfonyloxy-3-propenylphenyl)hexafluoropropane, 2,2-bis(4-phenylsulfonyloxy-3,5-dimethylphenyl)hexafluoropropane, 9,9-bis(4-phenylsulfonyloxyphenyl)fluorene, 9,9-bis(4-phenylsulfonyloxy-3-methylphenyl)fluorene, 9,9-bis(4-phenylsulfonyloxy-3,5-dimethylphenyl)fluorene, 9,9-bis(4-phenylsulfonyloxy-3-propenylphenyl)fluorene, 9,9-bis(4-phenylsulfonyloxy-3-phenylphenyl)fluorene, bis(4-phenylsulfonyloxy-3-methylphenyl)diphenylmethane, bis(4-phenylsulfonyloxy-3,5-dimethylphenyl)diphenylmethane, bis(4-phenylsulfonyloxy-3-propenylphenyl)diphenylmethane, bis(4-phenylsulfonyloxy-3-fluorophenyl)diphenylmethane, bis(4-phenylsulfonyloxy-3,5-difluorophenyl)diphenylmethane, 9,9-bis(4-phenylsulfonyloxy-3-fluorophenyl)fluorene, 9,9-bis(4-phenylsulfonyloxy-3,5-difluorophenyl)fluorene, bis(4-phenylsulfonyloxyphenyl)methane, bis(4-phenylsulfonyloxy-3-methylphenyl)methane, bis(4-phenylsulfonyloxy-3,5-dimethylphenyl)methane, bis(4-phenylsulfonyloxy-3-propenylphenyl)methane, bis(4-phenylsulfonyloxyphenyl)trifluoromethylphenylmethane, bis(4-phenylsulfonyloxyphenyl)phenylmethane, 2,2-bis(p-tolylsulfonyloxyphenyl)hexafluoropropane, bis(p-tolylsulfonyloxyphenyl)methane, bis(p-tolylsulfonyloxyphenyl)diphenylmethane, 2,2-bis(p-tolylsulfonyloxy-3-methylphenyl)hexafluoropropane, 2,2-bis(p-tolylsulfonyloxy-3-propenylphenyl)hexafluoropropane, 2,2-bis(p-tolylsulfonyloxy-3,5-dimethylphenyl)hexafluoropropane, 9,9-bis(p-tolylsulfonyloxyphenyl)fluorene, 9,9-bis(p-tolylsulfonyloxy-3-methylphenyl)fluorene, 9,9-bis(p-tolylsulfonyloxy-3,5-dimethylphenyl)fluorene, 9,9-bis(p-tolylsulfonyloxy-3-propenylphenyl)fluorene, 9,9-bis(p-tolylsulfonyloxy-3-phenylphenyl)fluorene, bis(p-tolylsulfonyloxy-3-methylphenyl)diphenylmethane, bis(p-tolylsulfonyloxy-3,5-dimethylphenyl)diphenylmethane, bis(p-tolylsulfonyloxy-3-propenylphenyl)diphenylmethane, bis(p-tolylsulfonyloxy-3-fluorophenyl)diphenylmethane, bis(p-tolylsulfonyloxy-3,5-difluorophenyl)diphenylmethane, 9,9-bis(p-tolylsulfonyloxy-fluorophenyl)fluorene, 9,9-bis(p-tolylsulfonyloxy-3,5-difluorophenyl)fluorene, bis(p-tolylsulfonyloxyphenyl)methane, bis(p-tolylsulfonyloxy-3-methylphenyl)methane, bis(p-tolylsulfonyloxy-3,5-dimethylphenyl)methane, bis(p-tolylsulfonyloxy-3-propenylphenyl)methane, bis(p-tolylsulfonyloxyphenyl)trifluoromethylphenylmethane, bis(p-tolylsulfonyloxyphenyl)phenylmethane, and the like can be given. In the invention, two or more of the compounds shown by the general formula (20) may be copolymerized.

In the invention, at least one of the compounds shown by the general formula (20) may be copolymerized with at least one compound selected from the group consisting of compounds shown by the following general formulas (27) and (28):

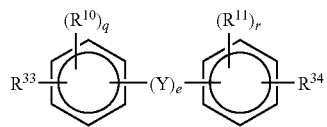

(27)

wherein $R^{10}$ and $R^{11}$ individually represent a hydrocarbon group having 1-20 carbon atoms, a cyano group, a nitro group, an alkoxyl group having 1-20 carbon atoms, an aryl group, or a halogen atom, $R^{33}$ and $R^{34}$ represent $-OSO_2Z$ (wherein Z represents an alkyl group, an alkyl halide group, or an aryl group), a chlorine atom, a bromine atom, or an iodine atom, Y represents at least one group selected from the group consisting of $-O-$, $-CO-$, $-COO-$, $-CONH-$, $-S-$, $-SO_2-$, and a phenylene group, e represents 0 to 1, and q and r represent integers from 0 to 4.

As $R^{10}$ and $R^{11}$ in the general formula (27), a fluorine atom and the like can be given as the halogen atom. As the organic group represented by $R^{10}$ and $R^{11}$, a methyl group, ethyl group, and the like can be given as the alkyl group, a trifluoromethyl group, pentafluoroethyl group, and the like can be given as the alkyl halide group, a propenyl group and the like can be given as the allyl group, and a phenyl group, pentafluorophenyl group, and the like can be given as the aryl group. As Z making up $-OSO_2Z$ in $R^{33}$ and $R^{34}$, a methyl group, ethyl group, and the like can be given as the alkyl group, a trifluoromethyl group and the like can be given as the alkyl halide group, and a phenyl group, p-tolyl group, p-fluorophenyl group, and the like can be given as the aryl group.

As examples of the compound shown by the general formula (27), 4,4'-dimethylsulfonyloxybiphenyl, 4,4'-dimethylsulfonyloxy-3,3'-dipropenylbiphenyl, 4,4'-dibromobiphenyl-4,4'-diiodobiphenyl, 4,4'-dimethylsulfonyloxy-3,3'-dimethylbiphenyl, 4,4'-dimethylsulfonyloxy-3,3-difluorobiphenyl, 4,4'-dimethylsulfonyloxy-3,3',5,5'-tetrafluorobiphenyl, 4,4'-dibromooctafluorobiphenyl, 4,4'-methylsulfonyloxyoctafluorobiphenyl, 3,3'-diallyl-4,4'-bis(4-fluorobenzenesulfonyloxy)biphenyl, 4,4'-dichloro-2,2'-trifluoromethylbiphenyl, 4,4'-dibromo-2,2'-trifluoromethylbiphenyl, 4,4'-diiodo-2,2'-trifluoromethylbiphenyl, bis(4-chlorophenyl)sulfone, 4,4'-dichlorobenzophenone, 2,4-dichlorobenzophenone, and the like can be given.

The compound shown by the general formula (27) may be used either individually or in combination of two or more.

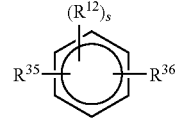

(28)

In the above formula, $R^{12}$ represents a hydrocarbon group having 1-20 carbon atoms, a cyano group, a nitro group, an alkoxyl group having 1-20 carbon atoms, an aryl group, or a halogen atom, $R^{35}$ and $R^{36}$ represent $-OSO_2Z$ (wherein Z represents an alkyl group, an alkyl halide group, or an aryl group), a chlorine atom, a bromine atom, or an iodine atom, and s represents an integer from 0 to 4.

As $R^{12}$ in the general formula (28), a fluorine atom and the like can be given as the halogen atom. As the organic group represented by $R^{10}$ and $R^{11}$, a methyl group, ethyl group, and the like can be given as the alkyl group, a trifluoromethyl group, pentafluoroethyl group, and the like can be given as the alkyl halide group, a propenyl group and the like can be given as the allyl group, and a phenyl group, pentafluorophenyl group, and the like can be given as the aryl group. As Z making up $-OSO_2Z$ in $R^{35}$ and $R^{36}$, a methyl group, ethyl group, and the like can be given as the alkyl group, a trifluoromethyl group and the like can be given as the alkyl halide group, and a phenyl group, p-tolyl group, p-fluorophenyl group, and the like can be given as the aryl group.

As examples of the compound shown by the general formula (28), o-dichlorobenzene, o-dibromobenzene, o-diiodobenzene, o-dimethylsulfonyloxybenzene, 2,3-dichlorotoluene, 2,3-dibromotoluene, 2,3-diiodotoluene, 3,4-dichlorotoluene, 3,4-dibromotoluene, 3,4-diiodotoluene, 2,3-dimethylsulfonyloxybenzene, 3,4-dimethylsulfonyloxybenzene, m-dichlorobenzene, m-dibromobenzene, m-diiodobenzene, m-dimethylsulfonyloxybenzene, 2,4-dichlorotoluene, 2,4-dibromotoluene, 2,4-diiodotoluene, 3,5-dichlorotoluene, 3,5-dibromotoluene, 3,5-diiodotoluene, 2,6-dichlorotoluene, 2,6-dibromotoluene, 2,6-diiodotoluene, 3,5-dimethylsulfonyloxytoluene, 2,6-dimethylsulfonyloxytoluene, 2,4-dichlorobenzotrifluoride, 2,4-dibromobenzotrifluoride, 2,4-diiodobenzotrifluoride, 3,5-dichlorobenzotrifluoride, 3,5-dibromotrifluoride, 3,5-diiodobenzotrifluoride, 1,3-dibromo-2,4,5,6-tetrafluorobenzene, 2,4-dichlorobenzylalcohol, 3,5-dichlorobenzylalcohol, 2,4-dibromobenzylalcohol, 3,5-dibromobenzylalcohol, 3,5-dichlorophenol, 3,5-dibromophenol, 3,5-dichloro-t-butoxycalbonyloxyphenyl, 3,5-dibromo-t-butoxycalbonyloxyphenyl, 2,4-dichlorobenzoic acid, 3,5-dichlorobenzoic acid, 2,4-dibromobenzoic acid, 3,5-dibromobenzoic acid, methyl 2,4-dichlorobenzoate, methyl 3,5-dichlorobenzoate, methyl 3,5-dibromobenzoate, methyl 2,4-dibromobenzoate, t-butyl 2,4-dichlorobenzoate, t-butyl 3,5-dichlorobenzoate, t-butyl 2,4-dibromobenzoate, t-butyl 3,5-dibromobenzoate, and the like can be given. Of these, m-dichlorobenzene, 2,4-dichlorotoluene, 3,5-dimethylsulfonyloxytoluene, 2,4-dichlorobenzotrifluoride, 2,4-dichlorobenzophenone, 2,4-dichlorophenoxybenzene, and the like are preferable. The compound shown by the general formula (28) may be used either individually or in combination of two or more.

The ratio of the repeating units in the compound 6 is determined so that, in the general formula (6), f is 5 to 100 mol %, and preferably 5 to 95 mol %, g is 0 to 95 mol %, and preferably 0 to 90 mol %, and h is 0 to 95 mol %, and preferably 0 to 90 mol % (f+g+h=100 mol %). If f is less than 5 mol % (g or h exceeds 95 mol %), the solubility of the polymer in the organic solvent may be insufficient.

As the catalyst used when producing the compound 6, a catalyst system containing a transition metal compound is preferable. The catalyst system includes, as essential components, (I) a transition metal salt and a ligand, or a transition metal (salt) to which a ligand is coordinated, and (II) a reducing agent. A "salt" may be further added in order to increase the polymerization rate. As examples of the transition metal salt, nickel compounds such as nickel chloride, nickel bromide, nickel iodide, and nickel acetylacetonato, palladium compounds such as palladium chloride, palladium bromide, and palladium iodide, iron compounds such as iron chloride, iron bromide, and iron iodide, cobalt compounds such as cobalt chloride, cobalt bromide, and cobalt iodide, and the like can be given. Of these, nickel chloride and nickel bromide are preferable.

As examples of the ligand, triphenyl phosphine, 2,2'-bipyridine, 1,5-cyclooctadiene, 1,3-bis(diphenylphosphino)propane, and the like can be given. Of these, triphenyl phosphine and 2,2'-bipyridine are preferable. The ligand may be used either individually or in combination of two or more. As examples of the transition metal (salt) to which a ligand is coordinated in advance, 2-triphenylphosphine nickel chloride, 2-triphenylphosphine nickel bromide, 2-triphenylphosphine nickel iodide, 2-triphenylphosphine nickel nitrate, 2,2'-bipyridine nickel chloride, 2,2'-bipyridine nickel bromide, 2,2'-bipyridine nickel iodide, 2,2'-bipyridine nickel nitrate, bis(1,5-cyclooctadiene)nickel, tetrakis(triphenylphosphine)nickel, tetrakis(triphenylphosphite)nickel, tetrakis(triphenylphosphine)palladium, and the like can be given. Of these, 2-triphenylphosphine nickel chloride and 2,2'-bipyridine nickel chloride are preferable.

As examples of the reducing agent which may be used in the catalyst system, iron, zinc, manganese, aluminum, magnesium, sodium, calcium, and the like can be given. Of these, zinc and manganese are preferable. The reducing agent may be used in a more activated state by causing the reducing agent to come in contact with an acid or an organic acid. As examples of the "salt" which may be used in the catalyst system, sodium compounds such as sodium fluoride, sodium chloride, sodium bromide, sodium iodide, and sodium sulfate, potassium compounds such as potassium fluoride, potassium chloride, potassium bromide, potassium iodide, and potassium sulfate, ammonium compounds such as tetraethylammonium fluoride, tetraethylammonium chloride, tetraethylammonium bromide, tetraethylammonium iodide, and tetraethylammonium sulfate, and the like can be given. Of these, sodium bromide, sodium iodide, potassium bromide, tetraethylammonium bromide, and tetraethylammonium iodide are preferable.

The amount of the transition metal salt or the transition metal (salt) to which a ligand is coordinated to be used in the catalyst system is usually 0.0001 to 10 mol, and preferably 0.01 to 0.5 mol for one mol of the total amount of the compounds shown by the general formulas (20), (27), and (28). If the amount is less than 0.0001 mol, the polymerization reaction does not proceed sufficiently. If the amount exceeds 10 mol, the molecular weight may be decreased. When using the transition metal salt and the ligand in the catalyst system, the amount of the ligand to be used is usually 0.1 to 100 mol, and preferably 1 to 10 mol for one mol of the transition metal salt. If the amount is less than 0.1 mol, the catalytic activity may be insufficient. If the amount exceeds 1100 mol, the molecular weight may be decreased. The amount of the reducing agent to be used in the catalyst system is usually 0.1 to 100 mol, and preferably 1 to 10 mol for one mol of the total amount of the compounds shown by the general formulas (20), (27), and (28). If the amount is less than 0.1 mol, polymerization does not proceed sufficiently. If the amount exceeds 100 mol, it may be difficult to purify the resulting polymer.

When using the "salt" in the catalyst system, the amount of the "salt" to be used is usually 0.001 to 100 mol, and preferably 0.01 to 1 mol for one mol of the total amount of the compounds shown by the general formulas (20), (27), and (28). If the amount is less than 0.001 mol, the effect of increasing the polymerization rate may be insufficient. If the amount exceeds 100 mol, it may be difficult to purify the resulting polymer.

As the polymerization solvent which may be used in the invention, tetrahydrofuran, cyclohexanone, dimethylsulfoxide, N,N-dimethylformamide, N,N-dimethylacetamide, 1-methyl-2-pyrrolidone, γ-butyrolactone, γ-butyrolactam, and the like can be given. Of these, tetrahydrofuran, N,N-dimethylformamide, N,N-dimethylacetamide, and 1-methyl-2-pyrrolidone are preferable. It is preferable to use the polymerization solvent after sufficiently drying the polymerization solvent. The total concentration of the compounds shown by the general formulas (20), (27), and (28) in the polymerization solvent is usually 1 to 100 wt %, and preferably 5 to 40 wt %. The polymerization temperature when polymerizing the polymer is usually 0 to 200° C., and preferably 50 to 80° C. The polymerization time is usually 0.5 to 100 hours, and preferably 1 to 40 hours. The polystyrene-reduced weight average molecular weight of the compound 6 is usually 1,000 to 1,000,000.

1.3.2 Compound 7

The polymer shown by the general formula (7) (hereinafter may be called "compound 7") may be produced by polymerizing monomers including compounds shown by the following general formulas (29) to (31) in the presence of a catalyst system, for example.

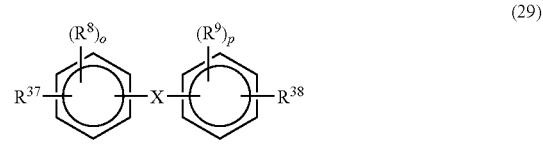

(29)

In the above general formula, $R^8$ and $R^9$ individually represent a hydrocarbon group having 1-20 carbon atoms, a cyano group, a nitro group, an alkoxyl group having 1-20 carbon atoms, an aryl group, or a halogen atom, X represents at least one group selected from a group shown by —CQQ'— (wherein Q and Q' individually represent an alkyl halide group, an alkyl group, a hydrogen atom, a halogen atom, or an aryl group) and a fluorenylene group, o and p represent integers from 0 to 4, and $R^{37}$ and $R^{38}$ represent at least one group or atom selected from the group consisting of a hydroxyl group, a halogen atom, and a —OM' group (wherein M' represents an alkali metal).

As specific examples of the compound (monomer) shown by the general formula (29), 2,2-bis(4-hydroxyphenyl)hexafluoropropane, bis(4-hydroxyphenyl)methane, bis(4-hydroxyphenyl)diphenylmethane, 2,2-bis(4-hydroxy-3-methylphenyl)hexafluoropropane, 2,2-bis(4-hydroxy-3-propenylphenyl)hexafluoropropane, 2,2-bis(4-hydroxy-3,5-dimethylphenyl)hexafluoropropane, 2,2-bis(4-hydroxyphenyl)propane, 2,2-bis(4-hydroxy-3-methylphenyl)propane, 2,2-bis(4-hydroxy-3-propenylphenyl)propane, 2,2-bis(4-hydroxy-3,5-dimethylphenyl)propane, 2,2-bis(4-hydroxy-3-fluorophenyl)propane, 2,2-bis(4-hydroxy-3,5-difluorophenyl)propane, 2,2-bis(4-chlorophenyl)hexafluoropropane, bis(4-chlorophenyl)methane, bis(4-chlorophenyl)diphenylmethane, 2,2-bis(4-chloro-3-methylphenyl)hexafluoropropane, 2,2-bis(4-chloro-3-propenylphenyl)hexafluoropropane, 2,2-bis(4-chloro-3,5-dimethylphenyl)hexafluoropropane, 2,2-bis(4-chlorophenyl)propane, 2,2-bis(4-chloro-3-methylphenyl)propane, 2,2-bis(4-chloro-3-propenylphenyl)propane, 2,2-bis(4-chloro-3,5-dimethylphenyl)propane, 2,2-bis(4-chloro-3-fluorophenyl)propane, 2,2-bis(4-chloro-3,5-difluorophenyl)propane, 2,2-bis(4-chlorophenyl)hexafluoropropane, bis(4-bromophenyl)methane, bis(4-bromophenyl)diphenylmethane, 2,2-bis(4-bromo-3-methylphenyl)hexafluoropropane, 2,2-bis(4-bromo-3-propenylphenyl)hexafluoropropane, 2,2-bis(4-bromo-3,5-dimethylphenyl)hexafluoropropane, 2,2-bis(4-bromophenyl)propane, 2,2-bis(4-bromo-3-methylphenyl)propane, 2,2-bis(4-bromo-3-propenylphenyl)propane, 2,2-bis(4-bromo-3,5-dimethylphenyl)propane, 2,2-bis(4-bromo-3-fluorophenyl)propane, 2,2-bis(4-bromo-3,5-difluorophenyl)propane, bis(4-fluorophenyl)methane, bis(4-fluorophenyl)diphenylmethane, 2,2-bis(4-fluoro-3-methylphenyl)hexafluoropropane, 2,2-bis(4-fluoro-3-propenylphenyl)hexafluoropropane, 2,2-bis(4-fluoro-3,5-dimethylphenyl)hexafluoropropane, 2,2-bis(4-fluorophenyl)propane, 2,2-bis(4-fluoro-3-methylphenyl)propane, 2,2-bis(4-fluoro-3-propenylphenyl)propane, 2,2-bis(4-fluoro-3,5-dimethylphenyl)propane, 2,2-bis(4-fluoro-3-fluorophenyl)propane, 2,2-bis(4-fluoro-3,5-difluorophenyl)propane, and the like can be given. A hydroxyl group in the bisphenol compound may be replaced by the —OM' group (wherein M' represents an alkali metal) by using a basic compound containing sodium, potassium, or the like. In the invention, two or more of the compounds shown by the general formula (29) may be copolymerized.

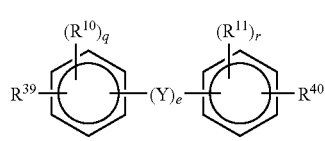

(30)

In the above general formula, $R^{10}$ and $R^{11}$ individually represent a hydrocarbon group having 1-20 carbon atoms, a cyano group, a nitro group, an alkoxyl group having 1-20 carbon atoms, an aryl group, or a halogen atom, $R^{39}$ and $R^{40}$ represent at least one group or atom selected from the group consisting of a hydroxyl group, a halogen atom, and a —OM' group (wherein M' represents an alkali metal), Y represents at least one group selected from the group consisting of —O—, —CO—, —COO—, —CONH—, —S—, —SO$_2$—, and a phenylene group, e represents 0 to 1, and q and r represent integers from 0 to 4.

As examples of the compound shown by the general formula (30), 4,4'-dichlorobiphenyl, 4,4'-dibromobiphenyl, 4,4'-difluorobiphenyl, 4,4'-diiodobiphenyl, 4,4'-dihydroxybiphenyl, 4,4'-dihydroxy-3,3'-dipropenylbiphenyl, 4,4'-dihydroxy-3,3'-dimethylbiphenyl, 4,4'-dihydroxy-3,3'-diethylbiphenyl, 4,4'-dimethylhydroxy-3,3',5,5'-tetrafluorobiphenyl, 4,4'-dibromooctafluorobiphenyl, 4,4-dihydroxyoctafluorobiphenyl, 3,3'-diallyl-4,4'-bis(4-hydroxy)biphenyl, 4,4'-dichloro-2,2'-trifluoromethylbiphenyl, 4,4'-dibromo-2,2'-trifluoromethylbiphenyl, 4,4'-diiodo-2,2'-trifluoromethylbiphenyl, bis(4-chlorophenyl)sulfone, bis(4-hydroxyphenyl)sulfone, bis(4-chlorophenyl)ether, bis(4-hydroxyphenyl)ether, 4,4'-dichlorobenzophenone, 4,4'-dihydroxybenzophenone, 2,4-dichlorobenzophenone, 2,4-dihydroxybenzophenone, and the like can be given. A hydroxyl group in the bisphenol compound may be replaced by the —OM' group (wherein M' represents an alkali metal) by using a basic compound containing sodium, potassium, or the like. The compound shown by the general formula (30) may be used either individually or in combination of two or more.

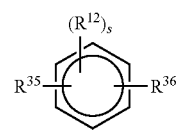

(31)

In the above general formula, $R^{12}$ represents a hydrocarbon group having 1-20 carbon atoms, a cyano group, a nitro group, an alkoxyl group having 1-20 carbon atoms, an aryl group, or a halogen atom, $R^{35}$ and $R^{36}$ represent —OSO$_2$Z (wherein Z represents an alkyl group, an alkyl halide group, or an aryl group), a chlorine atom, a bromine atom, or an iodine atom, and s represents an integer from 0 to 4.

As examples of the compound shown by the general formula (31), 1,2-dihydroxybenzene, 1,3-dihydroxybenzene, 1,4-dihydroxybenzene, 2,3-dihydroxytoluene, 2,5-dihydroxytoluene, 2,6-dihydroxytoluene, 3,4-dihydroxytoluene, 3,5-dihydroxytoluene, o-dichlorobenzene, o-dibromobenzene, o-diiodobenzene, o-dimethylsulfonyloxybenzene, 2,3-dichlorotoluene, 2,3-dibromotoluene, 2,3-diiodotoluene, 3,4-dichlorotoluene, 3,4-dibromotoluene, 3,4-diiodotoluene, 2,3-dimethylsulfonyloxybenzene, 3,4-dimethylsulfonyloxybenzene, m-dichlorobenzene, m-dibromobenzene, m-diiodobenzene, m-dimethylsulfonyloxybenzene, 2,4-dichlorotoluene, 2,4-dibromotoluene, 2,4-diiodotoluene, 3,5-dichlorotoluene, 3,5-dibromotoluene, 3,5-diiodotoluene, 2,6-dichlorotoluene, 2,6-dibromotoluene, 2,6-diiodotoluene, 3,5-dimethylsulfonyloxytoluene, 2,6-dimethylsulfonyloxytoluene, 2,4-dichlorobenzotrifluoride, 2,4-dibromobenzotrifluoride, 2,4-diiodobenzotrifluoride, 3,5-dichlorobenzotrifluoride, 3,5-dibromotrifluoride, 3,5-diiodobenzotrifluoride, 1,3-dibromo-2,4,5,6-tetrafluorobenzene, 2,4-dichlorobenzylalcohol, 3,5-dichlorobenzylalcohol, 2,4-dibromobenzylalcohol, 3,5-dibromobenzylalcohol, 3,5-dichlorophenol, 3,5-dibromophenol, 3,5-dichloro-t-butoxycalbonyloxyphenyl, 3,5-dibromo-t-butoxycalbonyloxyphenyl, 2,4-dichlorobenzoic acid, 3,5-dichlorobenzoic acid, 2,4-dibromobenzoic acid, 3,5-dibromobenzoic acid, methyl 2,4-dichlorobenzoate, methyl 3,5-dichlorobenzoate, methyl 3,5-dibromobenzoate, methyl 2,4-dibromobenzoate, t-butyl 2,4-dichlorobenzoate, t-butyl 3,5-dichlorobenzoate, t-butyl 2,4-dibromobenzoate, t-butyl 3,5-dibromobenzoate, and the like can be given. A hydroxyl group in the bisphenol compound may be replaced by the —OM' group (wherein M' represents an alkali metal) by using a basic compound containing sodium, potassium, or the like. The compound shown by the general formula (31) may be used either individually or in combination of two or more. The ratio of the repeating units in the compound 7 shown by the general formula (7) is determined so that I is 0 to 100 mol % and j is 0 to 100 mol % (I+j=100 mol %) in the general formula (7).

The compound 7 shown by the general formula (7) may be synthesized by heating the bisphenol compound and the dihalide compound in a solvent in the presence of an alkali metal compound, for example. The bisphenol compound is used in an amount of 45 to 55 mol %, and preferably 48 to 52 mol %, and the dihalide compound is used in an amount of 55 to 45 mol %, and preferably 52 to 48 mol %. If the amount of the bisphenol compound used is less than 45 mol % or exceeds 55 mol %, the molecular weight of the polymer is not sufficiently increased, whereby the coating applicability may be decreased. As examples of the alkali metal compound used to synthesize the compound 7, sodium hydroxide, potassium hydroxide, lithium hydroxide, sodium carbonate, potassium carbonate, lithium carbonate, sodium hydrogencarbonate, potassium hydrogencarbonate, lithium hydrogencarbonate, sodium hydride, potassium hydride, lithium hydride, metallic sodium, metallic potassium, metallic lithium, and the like can be given. The alkali metal compound may be used either individually or in combination of two or more. The alkali metal compound is used in an amount of usually 100 to 400 mol %, and preferably 100 to 250 mol % for the bisphenol compound. In order to promote the reaction, a promoter such as metallic copper, cuprous chloride, cupric chloride, cuprous bromide, cupric bromide, cuprous iodide, cupric iodide, cuprous sulfate, cupric sulfate, cuprous acetate, cupric acetate, cuprous formate, or cupric formate may be used. The promoter is used in an amount of usually 1 to 50 mol %, and preferably 1 to 30 mol % for the bisphenol compound.

As the solvent used for the reaction, pyridine, quinoline, benzophenone, diphenyl ether, dialkoxybenzene (the number of carbon atoms of the alkoxyl group is 1 to 4), trialkoxybenzene (the number of carbon atoms of the alkoxyl group is 1 to 4), diphenylsulfone, dimethylsulfoxide, dimethylsulfone, diethylsulfoxide, diethylsulfone, diisopropylsulfone, tetrahydrofuran, tetrahydrothiophene, sulfolane, N-methyl-2-pyrrolidone, N-ethyl-2-pyrrolidone, dimethylimidazolidinone, γ-butyrolactone, dimethylformamide, dimethylacetamide, or the like may be used. The solvent may be used either individually or in combination of two or more. The reaction concentration when synthesizing the compound 7 shown by the general formula (7) is 2 to 50 wt % based on the weight of the monomers, and the reaction temperature is 50 to 250° C. In order to remove metal salts and unreacted monomers produced during synthesis of the polymer, it is preferable to filter the reaction solution, reprecipitate the reaction solution in a poor solvent for the polymer, or wash the reaction solution with an acidic or alkaline solution. The weight average molecular weight of the resulting compound 7 determined by the GPC method is usually 500 to 500,000, and preferably 800 to 100,000.

1.3.3 Compound 8

The polymer shown by the general formula (8) (hereinafter may be called "compound 8") may be produced by polymerizing at least one compound selected from the group consisting of compounds shown by the following general formulas (32) and (33) and at least one compound selected from the group consisting of compounds shown by the following general formulas (34) and (35) in the presence of a catalyst, for example:

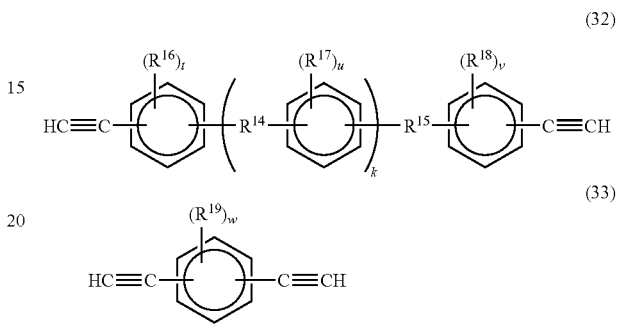

wherein $R^{14}$ to $R^{19}$ and k, t, u, v, and w are the same as defined for the general formulas (10) and (11); and

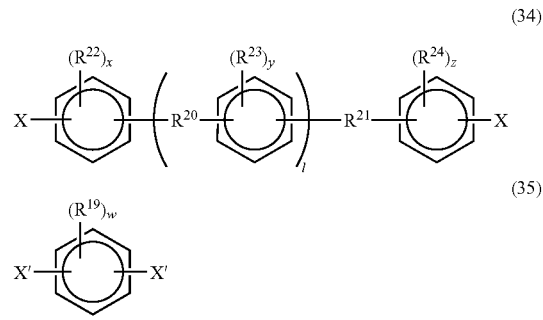

wherein $R^{19}$ to $R^{24}$ and l, w, x, y, and z are the same as defined for the general formulas (11) and (12), and X' represents a halogen atom.

As examples of the compound shown by the general formula (32), 4,4'-diethynylbiphenyl, 3,3'-diethynylbiphenyl, 3,4'-diethynylbiphenyl, 4,4'-diethynyldiphenyl ether, 3,3'-diethynyldiphenyl ether, 3,4'-diethynyldiphenyl ether, 4,4'-diethynylbenzophenone, 3,3'-diethynylbenzophenone, 3,4'-diethynylbenzophenone, 4,4'-diethynyldiphenylmethane, 3,3'-diethynyldiphenylmethane, 3,4'-diethynyldiphenylmethane, phenyl 4,4'-diethynylbenzoate, phenyl 3,3'-diethynylbenzoate, phenyl 3,4'-diethynylbenzoate, 4,4'-diethynylbenzanilide, 3,3'-diethynylbenzanilide, 3,4'-diethynylbenzanilide, 4,4'-diethynyldiphenylsulfide, 3,3'-diethynyldiphenylsulfide, 3,4'-diethynyldiphenylsulfide, 4,4'-diethynyldiphenylsulfone, 3,3'-diethynyldiphenylsulfone, 3,4'-diethynyldiphenylsulfone, 2,4,4'-triethynyldiphenyl ether, 9,9-bis(4-ethynylphenyl)fluorene, 4,4"-diethynyl-p-terphenyl, 4,4"-diethynyl-m-terphenyl, 4,4"-diethynyl-o-terphenyl, and the like can be given. These compounds may be used either individually or in combination of two or more.

As examples of the compound shown by the general formula (33), 1,2-diethynylbenzene, 1,3-diethynylbenzene, 1,4-diethynylbenzene, 2,5-diethynyltoluene, 3,4-diethynyltoluene, and the like can be given. These compounds may be used either individually or in combination of two or more.

As examples of the compound shown by the general formula (34), 1,2-bis(2-bromophenoxy)benzene, 1,2-bis(2-iodophenoxy)benzene, 1,2-bis(3-bromophenoxy)benzene, 1,2-bis(3-iodophenoxy)benzene, 1,2-bis(4-bromophenoxy)benzene, 1,2-bis(4-iodophenoxy)benzene, 1,3-bis(2-bromophenoxy)benzene, 1,3-bis(2-iodophenoxy)benzene, 1,3-bis(3-bromophenoxy)benzene, 1,3-bis(3-iodophenoxy)benzene, 1,3-bis(4-bromophenoxy)benzene, 1,3-bis(4-iodophenoxy)benzene, 1,4-bis(3-bromophenoxy)benzene, 1,4-bis(3-iodophenoxy)benzene, 1,4-bis(2-bromophenoxy)benzene, 1,4-bis(2-iodophenoxy)benzene, 1,4-bis(4-bromophenoxy)benzene, 1,4-bis(4-iodophenoxy)benzene, 1-(2-bromobenzoyl)-3-(2-bromophenoxy)benzene, 1-(2-iodobenzoyl)-3-(2-iodophenoxy)benzene, 1-(3-bromobenzoyl)-3-(3-bromophenoxy)benzene, 1-(3-iodobenzoyl)-3-(3-iodophenoxy)benzene, 1-(4-bromobenzoyl)-3-(4-bromophenoxy)benzene, 1-(4-iodobenzoyl)-3-(4-iodophenoxy)benzene, 1-(3-bromobenzoyl)-4-(3-bromophenoxy)benzene, 1-(3-iodobenzoyl)-4-(3-iodophenoxy)benzene, 1-(4-bromobenzoyl)-4-(4-bromophenoxy)benzene, 1-(4-iodobenzoyl)-4-(4-iodophenoxy)benzene, 2,2'-bis(2-bromophenoxy)benzophenone, 2,2'-bis(2-iodophenoxy)benzophenone, 2,4'-bis(2-bromophenoxy)benzophenone, 2,4'-bis(2-iodophenoxy)benzophenone, 4,4'-bis(2-bromophenoxy)benzophenone, 4,4'-bis(2-iodophenoxy)benzophenone, 2,2'-bis(3-bromophenoxy)benzophenone, 2,2'-bis(3-iodophenoxy)benzophenone, 2,4'-bis(3-bromophenoxy)benzophenone, 2,4'-bis(3-iodophenoxy)benzophenone, 4,4'-bis(3-bromophenoxy)benzophenone, 4,4'-bis(3-iodophenoxy)benzophenone, 2,2'-bis(4-bromophenoxy)benzophenone, 2,2'-bis(4-iodophenoxy)benzophenone, 2,4'-bis(4-bromophenoxy)benzophenone, 2,4'-bis(4-iodophenoxy)benzophenone, 4,4'-bis(4-bromophenoxy)benzophenone, 4,4'-bis(4-iodophenoxy)benzophenone, 2,2'-bis(2-bromobenzoyl)benzophenone, 2,2'-bis(2-iodobenzoyl)benzophenone, 2,4'-bis(2-bromobenzoyl)benzophenone, 2,4'-bis(2-iodobenzoyl)benzophenone, 4,4'-bis(2-bromobenzoyl)benzophenone, 4,4'-bis(2-iodobenzoyl)benzophenone, 2,2'-bis(3-bromobenzoyl)benzophenone, 2,2'-bis(3-iodobenzoyl)benzophenone, 2,4'-bis(3-bromobenzoyl)benzophenone, 2,4'-bis(3-iodobenzoyl)benzophenone, 4,4'-bis(3-bromobenzoyl)benzophenone, 4,4'-bis(3-iodobenzoyl)benzophenone, 2,2'-bis(4-bromobenzoyl)benzophenone, 2,2'-bis(4-iodobenzoyl)benzophenone, 2,4'-bis(4-bromobenzoyl)benzophenone, 2,4'-bis(4-iodobenzoyl)benzophenone, 4,4'-bis(4-bromobenzoyl)benzophenone, 4,4'-bis(4-iodobenzoyl)benzophenone, 3,4'-bis(2-bromophenoxy)diphenyl ether, 3,4'-bis(2-iodophenoxy)diphenyl ether, 3,4'-bis(3-bromophenoxy)diphenyl ether, 3,4'-bis(3-iodophenoxy)diphenyl ether, 3,4'-bis(4-bromophenoxy)diphenyl ether, 3,4'-bis(4-iodophenoxy)diphenyl ether, 4,4'-bis(2-bromophenoxy)diphenyl ether, 4,4'-bis(2-iodophenoxy)diphenyl ether, 4,4'-bis(3-bromophenoxy)diphenyl ether, 4,4'-bis(3-iodophenoxy)diphenyl ether, 4,4'-bis(4-bromophenoxy)diphenyl ether, 4,4'-bis(4-iodophenoxy)diphenyl ether, 3,4'-bis(2-bromobenzoyl)diphenyl ether, 3,4'-bis(2-iodobenzoyl)diphenyl ether, 3,4'-bis(3-bromobenzoyl)diphenyl ether, 3,4'-bis(3-iodobenzoyl)diphenyl ether, 3,4'-bis(4-bromobenzoyl)diphenyl ether, 3,4'-bis(4-iodobenzoyl)diphenyl ether, 4,4'-bis(2-bromobenzoyl)diphenyl ether, 4,4'-bis(2-iodobenzoyl)diphenyl ether, 4,4'-bis(3-bromobenzoyl)diphenyl ether, 4,4'-bis(3-iodobenzoyl)diphenyl ether, 4,4'-bis(4-bromobenzoyl)diphenyl ether, 4,4'-bis(4-iodobenzoyl)diphenyl ether, 2,2'-bis(4-chlorophenyl)diphenylmethylidene, 2,2'-bis(4-iodophenyl)diphenylmethylidene, 2,2'-bis(4-bromophenyl)diphenylmethylidene, 2,2'-bis(3-chlorophenyl)diphenylmethylidene, 2,2'-bis(3-iodophenyl)diphenylmethylidene, 2,2'-bis(3-bromophenyl)diphenylmethylidene, 9,9-bis(4-chlorophenyl)fluorene, 9,9-bis(4-iodophenyl)fluorene, 9,9-bis(4-bromophenyl)fluorene, 9,9-bis(3-chlorophenyl)fluorene, 9,9-bis(3-iodophenyl)fluorene, 9,9-bis(3-bromophenyl)fluorene, 4,4"-dichloro-m-terphenyl, 4,4"-diiodo-m-terphenyl, 4,4"-dibromo-m-terphenyl, 4,4"-dichloro-p-terphenyl, 4,4"-diiodo-p-terphenyl, 4,4"-dibromo-p-terphenyl, and the like can be given. These compounds may be used either individually or in combination of two or more.

As examples of the compound shown by the general formula (35), 1,2-dichlorobenzene, 1,3-dichlorobenzene, 1,4-dichlorobenzene, 1,2-diiodobenzene, 1,3-diiodobenzene, 1,4-diiodobenzene, 1,2-dibromobenzene, 1,3-dibromobenzene, 1,4-dibromobenzene, 2,3-dichlorotoluene, 2,4-dichlorotoluene, 2,5-dichlorotoluene, 2,6-dichlorotoluene, 3,4-dichlorotoluene, 2,3-diiodotoluene, 2,4-diiodotoluene, 2,5-diiodotoluene, 2,6-diiodotoluene, 3,4-diiodotoluene, 2,3-dibromotoluene, 2,4-dibromotoluene, 2,5-dibromotoluene, 2,6-dibromotoluene, 3,4-dibromotoluene, and the like can be given. These compounds may be used either individually or in combination of two or more.

In the invention, the compound 8 shown by the general formula (8) is produced by polymerizing the compound shown by the general formula (32) and/or the compound shown by the general formula (33) and the compound shown by the general formula (34) and/or the compound shown by the general formula (35) in the presence of a catalyst. The compound shown by the general formula (32) and/or the compound shown by the general formula (33) and the compound shown by the general formula (34) and/or the compound shown by the general formula (35) are used so that the total amount of the compound shown by the general formula (34) and/or the compound shown by the general formula (35) is 0.8 to 1.2 mol, preferably 0.9 to 1.1 mol, and particularly preferably 0.95 to 1.05 mol for one mol of the total amount of the compound shown by the general formula (32) and/or the compound shown by the general formula (33). If the total amount of the compound shown by the general formula (34) and/or the compound shown by the general formula (35) is less than 0.8 mol or exceeds 1.2 mol, the molecular weight of the resulting polymer is not sufficiently increased.

In the production of the compound 8, it is preferable to polymerize the compounds shown by the general formulas (32) to (35) in the presence of a catalyst containing a transition metal compound. A catalyst containing a transition metal compound and a basic compound is preferable, with a catalyst containing the following components (a), (b), and (c) being particularly preferable:

(a) Palladium salt and substance which bonds to palladium as ligand or which can supply group (atomic group) which bonds to palladium as ligand to form complex (including complex ion) (hereinafter called "ligand-forming substance"), or palladium complex (ligand-forming substance may be added, if necessary);

(b) Monovalent copper compound; and (c) Basic compound.

As examples of the palladium salt used as the component (a), palladium chloride, palladium bromide, palladium iodide, and the like can be given. These compounds may be used either individually or in combination of two or more. The palladium salt is used in an amount of usually 0.0001 to 10 mol, and preferably 0.001 to 1 mol for one mol of the total amount of the compounds shown by the general formulas (32) to (35). If the amount is less than 0.0001 mol, polymerization may not proceed sufficiently. If the amount exceeds 10 mol, it may be difficult to purify the resulting polymer.

As examples of the ligand-forming substance used as the component (a), triphenylphosphine, tri-o-tolylphosphine, tricyanophenylphosphine, tricyanomethylphosphine, and the like can be given. Of these, triphenylphosphine is preferable. These compounds may be used either individually or in combination of two or more. The ligand-forming substance is used in an amount of usually 0.0004 to 50 mol, and preferably 0.004 to 5 mol for one mol of the total amount of the compounds shown by the general formulas (32) to (35). If the amount is less than 0.0004 mol, polymerization may not proceed sufficiently. If the amount exceeds 50 mol, it may be difficult to purify the resulting polymer.

As examples of the palladium complex used as the component (a), dichlorobis(triphenylphosphine)palladium, dibromobis(triphenylphosphine)palladium, diiodobis(triphenylphosphine)palladium, dichlorobis(tri-o-tolylphosphine)palladium, dichlorobis(tricyanophenylphosphine)palladium, dichlorobis(tricyanomethylphosphine)palladium, dibromobis(tri-o-tolylphosphine)palladium, dibromobis(tricyanophenylphosphine)palladium, dibromobis(tricyanomethylphosphine)palladium, diiodobis(tri-o-tolylphosphine)palladium, diiodobis(tricyanophenylphosphine)palladium, diiodobis(tricyanomethylphosphine)palladium, tetrakis(triphenylphosphine)palladium, tetrakis(tri-o-tolylphosphine)palladium, tetrakis(tricyanophenylphosphine)palladium, tetrakis(tricyanomethylphosphine)palladium, and the like can be given. Of these, dichlorobis(triphenylphosphine)palladium and tetrakis(triphenylphosphine)palladium are preferable. These compounds may be used either individually or in combination of two or more. The palladium complex is used in an amount of usually 0.0001 to 10 mol, and preferably 0.001 to 1 mol for one mol of the total amount of the compounds shown by the general formulas (32) to (35). If the amount is less than 0.0001 mol, polymerization may not proceed sufficiently. If the amount exceeds 10 mol, it may be difficult to purify the resulting polymer.

As examples of the monovalent copper compound, copper (I) chloride, copper(I) bromide, copper(I) iodide, and the like can be given. These compounds may be used either individually or in combination of two or more. The monovalent copper compound is used in an amount of usually 0.0001 to 10 mol, and preferably 0.001 to 1 mol for one mol of the total amount of the compounds shown by the general formulas (32) to (35). If the amount is less than 0.0001 mol, polymerization may not proceed sufficiently. If the amount exceeds 10 mol, it may be difficult to purify the resulting polymer.

As examples of the basic compound, pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclooctane, diazabicyclononane, diazabicycloundecene, tetramethylammonium hydroxide, diethylamine, ammonia, n-butylamine, imidazole, and the like can be given. Of these, diethylamine, piperidine, and n-butylamine are preferable. These compounds may be used either individually or in combination of two or more. The basic compound is used in an amount of preferably 1 to 1000 mol, and still more preferably 1 to 100 mol for one mol of the total amount of the compounds shown by the general formulas (32) to (35). If the amount is less than 1 mol, polymerization may not proceed sufficiently. If the amount exceeds 100 mol, it may be uneconomical.

1.3.4 Compound 9

The polymer shown by the general formula (9) (hereinafter may be called "compound 9") may be produced by reacting a compound shown by the following general formula (36) and a compound shown by the following general formulas (37) and (38), for example.

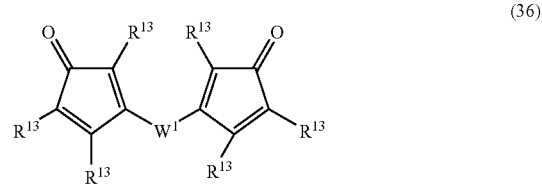

In the general formulas (36) to (38), $R^{13}$ and $R^{13'}$ represent a hydrogen atom or at least one group selected from the group consisting of the aromatic groups shown by the general formulas (13) and (14), and $W^1$ and $W^2$ represent at least one group selected from the group consisting of the divalent aromatic groups shown by the general formulas (15) and (16).

The compound 9 shown by the general formula (9) may be produced by subjecting the cyclopentadienone group shown by the general formula (36) and the acetylene group shown by the general formulas (37) and (38) to a Diels-Alder reaction.

The number average molecular weight (Mn) of the compound 9 is greater than 3,500, and preferably 4,000, and is less than preferably 6,400, and still more preferably 6,000. The weight average molecular weight (Mw) of the compound 9 is greater than 500, and preferably 8,000, and is less than preferably 15,000, and still more preferably 12,000. The compound 9 has a polydispersity (Mw/Mn) of preferably less than about 2.5, and still more preferably less than about 2.3.

A solvent may be used in the forming step of the organic film of the invention, as required. There are no specific limitations to the polymerization solvent. As examples of the polymerization solvent, halogen solvents such as chloroform, dichloromethane, 1,2-dichloroethane, chlorobenzene, and dichlorobenzene; aromatic hydrocarbon solvents such as benzene, toluene, xylene, mesitylene, and diethyl benzene; ether solvents such as diethyl ether, tetrahydrofuran, dioxane, diglyme, anisole, diethylene glycol dimethyl ether, diethylene glycol diethyl ether, and diethylene glycol methyl ethyl ether; ketone solvents such as acetone, methyl ethyl ketone, 2-heptanone, cyclohexanone, and cyclopentanone; ester solvents such as methyl acetate, ethyl acetate, propyl acetate, butyl acetate, methyl lactate, ethyl lactate, butyl lactate, and γ-butyrolactone; amide solvents such as N,N-dimethylformamide, N,N-dimethylacetamide, and N-methyl-2-pyrrolidone; and the like can be given. It is preferable to use the solvent after sufficiently drying and deoxidizing the solvent. The solvent may be used either individually or in combination of two or more. The monomer (polymerization component) concentration in the polymerization solvent is preferably 1 to 80 wt %, and still more preferably 5 to 60 wt %. The polymerization temperature is preferably 0 to 150° C., and still more preferably 5 to 100° C. The polymerization time is preferably 0.5 to 100 hours, and still more preferably 1 to 40 hours.

In the invention, the organic film is formed by dissolving at least one polymer selected from the group consisting of the compounds 6 to 9 in an organic solvent to obtain the film-forming composition (III), applying the film-forming composition (III) to a substrate to form a coating (third coating), and heating the coating. The organic film is obtained in this manner. As examples of the organic solvent used in the film-forming composition (III), aliphatic hydrocarbon solvents such as n-pentane, isopentane, n-hexane, isohexane, n-heptane, isoheptane, 2,2,4-trimethylpentane, n-octane, isooctane, cyclohexane, and methylcyclohexane; aromatic hydrocarbon solvents such as benzene, toluene, xylene, ethylbenzene, trimethylbenzene, methylethylbenzene, n-propylebenzene, isopropylebenzene, diethylbenzene, isobutylbenzene, triethylbenzene, diisopropylbenzene, n-amylnaphthalene, and trimethylbenzene; monohydric alcohol solvents such as methanol, ethanol, n-propanol, isopropanol, n-butanol, isobutanol, sec-butanol, t-butanol, n-pentanol, isopentanol, 2-methylbutanol, sec-pentanol, t-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol-4, n-decanol, sec-undecyl alcohol, trimethylnonyl alcohol, sec-tetradecyl alcohol, sec-heptadecyl alcohol, cyclohexanol, methylcyclohexanol, 3,3,5-trimethylcyclohexanol, benzyl alcohol, phenylmethylcarbinol, and diacetone alcohol; polyhydric alcohol solvents such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, tripropylene glycol, and glycerol; ketone solvents such as acetone, methyl ethyl ketone, methyl n-propyl ketone, methyl n-butyl ketone, diethyl ketone, methyl isobutyl ketone, methyl n-pentyl ketone, ethyl n-butyl ketone, methyl n-hexyl ketone, diisobutyl ketone, trimethylnonanone, cyclohexanone, cyclopentanone, 2-hexanone, methyl cyclohexanone, 2,4-pentanedione, acetonylacetone, diacetone alcohol, acetophenone, and fenchone; ether solvents such as ethyl ether, isopropyl ether, n-butyl ether, n-hexyl ether, 2-ethylhexyl ether, ethylene oxide, 1,2-propylene oxide, dioxolane, 4-methyl dioxolane, dioxane, dimethyl dioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethyl butyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, tripropylene glycol monomethyl ether, tetrahydrofuran, and 2-methyltetrahydrofuran; ester solvents such as diethyl carbonate, methyl acetate, ethyl acetate, γ-butyrolactone, γ-valerolactone, n-propyl acetate, isopropyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxy triglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents such as N-methylformamide, N,N-dimethylformamide, N,N-dimethylformamide, acetamide, N-methylacetamide, N,N-dimethylacetamide, N-methylpropioneamide, and N-methylpyrrolidone; sulfur-containing solvents such as dimethyl sulfide, diethyl sulfide, thiophene, tetrahydrothiophene, dimethylsulfoxide, sulfolane, and 1,3-propanesultone; and the like can be given. These solvents may be used either individually or in combination of two or more.

In the invention, the film-forming composition (III) may further include components such as colloidal silica, organic polymer other than the compounds 6 to 9 used to form the organic film, surfactant, silane coupling agent, radical generator, or compound containing a polymerizable double bond or polymerizable triple bond. As examples of the organic polymer other than the compounds 6 to 9, a polymer having a sugar chain structure, vinyl amide polymer, (meth)acrylic polymer, aromatic vinyl compound polymer, dendrimer, polyimide, polyamic acid, polyamide, polyquinoxaline, polyoxadizole, fluorine-containing polymer, polymer having a polyalkylene oxide structure, and the like can be given.

As examples of the polymer having a polyalkylene oxide structure, polymers having a polymethylene oxide structure, polyethylene oxide structure, polypropylene oxide structure, polytetramethylene oxide structure, polybutylene oxide structure, and the like can be given.

As examples of the surfactant, a nonionic surfactant, anionic surfactant, cationic surfactant, and amphoteric surfactant can be given. Specific examples include a fluorine-containing surfactant, silicone surfactant, polyalkylene oxide surfactant, poly(meth)acrylate surfactant, and the like. Of these, the fluorine-containing surfactant and the silicone surfactant are preferable.

As examples of the silane coupling agent, 3-glycidyloxypropyltrimethoxysilane, 3-aminoglycidyloxypropyltriethoxysilane, 3-methacryloxypropyltrimethoxysilane, 3-glycidyloxypropylmethyldimethoxysilane, 1-methacryloxypropylmethyldimethoxysilane, 3-aminopropyltrimethoxysilane, 3-aminopropyltriethoxysilane, 2-aminopropyltrimethoxysilane, 2-aminopropyltriethoxysilane, N-(2-aminoethyl)-3-aminopropyltrimethoxysilane, N-(2-aminoethyl)-3-aminopropylmethyldimethoxysilane, 3-ureidopropyltrimethoxysilane, 3-ureidopropyltriethoxysilane, N-ethoxycarbonyl-3-aminopropyltrimethoxysilane, N-ethoxycarbonyl-3-aminopropyltriethoxysilane, N-triethoxysilylpropyltriethylenetriamine, N-triethoxysilylpropyltriethylenetriamine, 10-trimethoxysilyl-1,4,7-triazadecane, 10-triethoxysilyl-1,4,7-triazadecane, 9-trimethoxysilyl-3,6-diazanonylacetate, 9-triethoxysilyl-3,6-diazanonylacetate, N-benzyl-3-aminopropyltrimethoxysilane, N-benzyl-3-aminopropyltriethoxysilane, N-phenyl-3-aminopropyltrimethoxysilane, N-phenyl-3-aminopropyltriethoxysilane, N-bis(oxyethylene)-3-aminopropyltrimethoxysilane, N-bis(oxyethylene)-3-aminopropyltriethoxysilane, poly(vinylmethoxysiloxane), poly(vinylethoxysiloxane), and the like can be given. The silane coupling agent may be used either individually or in combination of two or more.

As examples of the radical generator, organic peroxides such as isobutyryl peroxide, α,α'-bis(neodecanoylperoxy)diisopropylbenzene, cumylperoxyneodecanoate, di-n-propylperoxydicarbonate, diisopropylperoxydicarbonate, 1,1,3,3-tetramethylbutylperoxyneodecanoate, bis(4-t-butylcyclohexyl)peroxydicarbonate, 1-cyclohexyl-1-methylethylperoxyneodecanoate, di-2-ethoxyethylperoxydicarbonate, di(2-ethylhexylperoxy) dicarbonate, t-hexylperoxyneodecanoate, dimethoxybutylperoxydicarbonate, di(3-methyl-3-methoxybutylperoxy)dicarbonate, t-butylperoxyneodecanoate, 2,4-dichlorobenzoyl peroxide, t-hexylperoxy pivalate, t-butylperoxy pivalate, 3,5,5-trimethylhexanoyl peroxide, octanoyl peroxide, lauroyl peroxide, stearoyl peroxide, 1,1,3,3-tetramethylbutylperoxy 2-ethylhexanoate, succinic peroxide, 2,5-dimethyl-2,5-di(2-ethylhexanoylperoxy)hexane, 1-cyclohexyl-1-methylethylperoxy 2-ethylhexanoate, t-hexylperoxy 2-ethylhexanoate, t-butylperoxy 2-ethylhexanoate, m-toluoylbenzoyl peroxide, benzoyl peroxide, t-butylperoxy isobutyrate, di-t-butylperoxy-2-methylcyclohexane, 1,1-bis(t-hexylperoxy)-3,3,5-trimethylcyclohexane, 1,1-bis(t-hexylperoxy)cyclohexane, 1,1-bis(t-butylperoxy)-3,3,5-trimethylcyclohexane, 1,1-bis(t-butylperoxy)cyclohexane, 2,2-bis(4,4-di-t-butylperoxycyclohexyl)propane, 1,1-bis(t-butylperoxy)cyclodecane, t-hexylperoxyisopropylmonocarbonate, t-butylperoxymaleic acid, t-butylperoxy-3,3,5-trimethylhexanoate, t-butylperoxy laurate, 2,5-dimethyl-2,5-di (m-toluoylperoxy)hexane, t-butylperoxyisopropylmonocarbonate, t-butylperoxy-2-ethylhexylmonocarbonate, t-hexylperoxy benzoate, 2,5-dimethyl-2,5-di(benzoylperoxy)hexane, t-butylperoxy acetate, 2,2-bis(t-butylperoxy)butane, t-butylperoxy benzoate, n-butyl-4,4-bis(t-butylperoxy)valerate, di-t-butylperoxy isophthalate, α,α'-bis(t-butylperoxy)diisopropylbenzene, dicumyl peroxide, 2,5-dimethyl-2,5-di(t-butylperoxy)hexane, t-butylcumyl peroxide, di-t-butyl peroxide, p-menthane hydroperoxide, 2,5-dimethyl-2,5-di(t-butylperoxy)-3-hexyne, diisopropylbenzene hydroperoxide, t-butyltrimethylsilyl peroxide, 1,1,3,3-tetramethylbutyl hydroperoxide, cumene hydroperoxide, t-hexyl hydroperoxide, t-butyl hydroperoxide, and 2,3-dimethyl-2,3-diphenylbutane; and bibenzyl compounds such as dibenzyl, 2,3-dimethyl-2,3-diphenylbutane, α,α'-dimethoxy-α,α'-diphenylbibenzyl, α,α'-diphenyl-α-methoxybibenzyl, α,α'-diphenyl-α,α'-dimethoxybibenzyl, α,α'-dimethoxy-α,α'-dimethylbibenzyl, α,α'-dimethoxybibenzyl, 3,4-dimethyl-3,4-diphenyl-n-hexane, 2,2,3,3-tetraphenylsuccinic acid nitrile can be given. These compounds may be used either individually or in combination of two or more.

As examples of the compound containing a polymerizable double bond, allyl compounds such as allylbenzene, diallylbenzene, triallylbenzene, allyloxybenzene, diallyloxybenzene, triallyloxybenzene, α,ω-diallyloxyalkane, α,ω-diallylalkene, α,ω-diallylalkene, allylamine, diallylamine, triallylamine, N-allylphthalimide, N-allylpyromellitimide, N,N'-diallylurea, triallylisocyanurate, and 2,2'-diallylbisphenol A; vinyl compounds such as styrene, divinylbenzene, trivinylbenzene, stilbene, propenylbenzene, dipropenylbenzene, tripropenylbenzene, phenyl vinyl ketone, methyl styryl ketone, α,α'-divinylalkane, α,α'-divinylalkene, α,α'-divinylalkyne, α,α'-divinyloxyalkane, α,α'-divinylalkene, α,α'-divinylalkyne, α,α'-diacryloxyalkane, α,α'-diacrylalkene, α,α'-diacrylalkene, α,α'-dimethacryloxyalkane, α,α'-dimethacrylalkene, α,α'-dimethacrylalkene, bisacryloxybenzene, trisacryloxybenzene, bismethacryloxybenzene, trismethacryloxybenzene, N-vinylphthalimide, N-vinylpyromellitimide; polyarylene ether containing 2,2'-diallyl-4,4'-biphenol and polyarylene containing 2,2'-diallyl-4,4'-biphenol; and the like can be given. These compounds may be used either individually or in combination of two or more. As examples of the compound containing a polymerizable triple bond, at least one of compounds shown by the following general formulas (39) and (40) can be given.

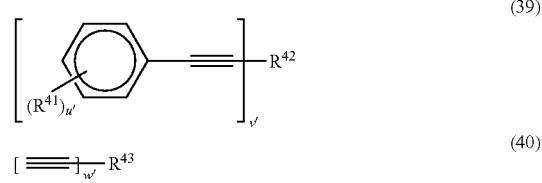

In the general formulas (39) and (40), $R^{41}$ represents an alkyl group having 1 to 3 carbon atoms, $R^{42}$ represents a v'-valent aromatic group, $R^{43}$ represents a w'-valent aromatic group, u' represents an integer from 1 to 5, and v' and w' individually represent integers from 2 to 6.

As examples of the alkyl group having 1 to 3 carbon atoms represented by $R^{41}$ in the formula (39), a methyl group, ethyl group, n-propyl group, and isopropyl group can be given.

As other examples of the compound containing a polymerizable triple bond, ethynylbenzene, bis(trimethylsilylethynyl)benzene, tris(trimethylsilylethynyl)benzene, tris(trimethylsilylethynyl)benzene, bis(trimethylsilylethynylphenyl) ether, trimethylsilylethynylbenzene, and the like can be given. The compound containing a polymerizable triple bond may be used either individually or in combination of two or more.

The total solid content of the film-forming composition (III) may be appropriately adjusted according to the application, preferably in the range of 1 to 30 wt %. If the total solid content of the composition is 1 to 30 wt %, the resulting coating has a thickness within an appropriate range, and the composition exhibits a more excellent storage stability.

2. Laminate Formation Method

A method of forming a laminate according to the invention includes forming a first coating for forming the first silica-based film on a substrate, forming a second coating for forming the second silica-based film, which includes an organic group containing a carbon-carbon double bond or a carbon-carbon triple bond, on the first coating, forming a third coating for forming the organic film on the second coating, and curing the multilayer film of the first to third coatings.

In the method of forming a laminate according to the invention, as examples of the substrate to which the first coating is applied, Si-containing layers such as Si, $SiO_2$, SiN, SiC, and SiCN can be given. When applying the film-forming composition to the substrate, a coating method such as spin coating, dip coating, roll coating, or spray coating may be used. After applying the film-forming composition to the substrate, the substrate is subjected to a heat treatment or the like to remove the organic solvent. The first coating is thus formed on the substrate. The thickness of the first coating is preferably 30 to 500 nm, and still more preferably 50 to 300 nm.

The second coating for forming the second silica-based film and the third coating for forming organic insulating film are formed on the first coating. The second and third coatings may be formed in the same manner as the first coating. The thickness of the second coating is preferably 5 to 100 nm, and still more preferably 10 to 50 nm. The thickness of the third coating is preferably 30 to 500 nm, and still more preferably 50 to 300 nm.

The multilayer film in which the first to third coatings are layered is then subjected to the curing treatment. The curing treatment may be carried out by heating or applying electron beams. When curing the multilayer film by heating, heating may be performed preferably at 300 to 500° C., and still more preferably at 350 to 450° C.

3. Insulating Film

An insulating film of the invention includes the above-described laminate. Therefore, the insulating film of the invention has a low dielectric constant and improved adhesion. Therefore, according to the invention, an insulating film useful for applications such as an interlayer dielectric for semiconductor devices such as an LSI, system LSI, DRAM, SDRAM, RDRAM, and D-RDRAM, a protective film such as a surface coat film for semiconductor devices, an intermediate layer in the semiconductor manufacturing process using a multi-layer resist, an interlayer dielectric of a multi-layer interconnect substrate, and a protective film and an insulation film for a liquid crystal display device can be provided.

4. Semiconductor Device

A semiconductor device of the invention includes the above-described insulating film. When using the insulating film as an interlayer dielectric or a planarization insulating film, since the adhesion of the insulating film is secured sufficiently, a highly reliable semiconductor device in which film delamination during CMP processing or package processing is prevented can be provided.

5. EXAMPLE

The invention is described below in more detail by way of examples. In the examples and comparative examples, "part" and "%" respectively indicate "part by weight" and "wt %" unless otherwise indicated. The following description generally represents aspects of the invention, and should not be construed as limiting the invention without specific reasons. In the example, film-forming composition solutions (I) to (III) for respectively forming the first silica-based film, the second silica-based film, and the organic film were prepared. A laminate was formed by using the resulting film-forming composition solutions (I) to (III). The adhesion and the relative dielectric constant of the resulting laminate were measured according to the following methods.

5.1 Evaluation Method 5.1.1 Adhesion

The fracture toughness between the inorganic insulating film and the organic insulating film in the resulting laminate was measured by using a four-point bending method. The resulting fracture toughness was employed as the index of the adhesion.

5.1.2 Measurement of Relative Dielectric Constant

Aluminum was deposited on a wafer on which the laminate was formed to prepare a dielectric constant evaluation substrate. The relative dielectric constant was calculated from the capacitance at 10 kHz using an electrode "HP16451B" and a precision LCR meter "HP4284A" (manufactured by Yokogawa-Hewlett-Packard, Ltd.).

5.1.3 Weight Average Molecular Weight (Mw)

The weight average molecular weight (Mw) of the polymer was measured by a gel permeation chromatography (GPC) method under the following conditions.

Sample: A sample was prepared by dissolving 1 g of the polymer in 100 cc of tetrahydrofuran used as a solvent.

Standard polystyrene: Standard polystyrene manufactured by Pressure Chemical of the U.S.

Device: High-temperature high-speed gel permeation chromatogram (Model 150-C ALC/GPC) manufactured by Waters of the U.S.

Column: SHODEX A-80M (length: 50 cm) manufactured by Showa Denko K.K.

Measurement temperature: 40° C.

Flow rate: 1 cc/min 5.2 Synthesis Example 1

Preparation of Film-forming Composition Solution (I)

In a separable flask made of quartz, 109.0 g of methyltrimethoxysilane (53 g when converted into complete hydrolysis-condensation product) and 42 g of tetraethoxysilane (12 g when converted into complete hydrolysis-condensation product) were added to a mixed solution of 80.0 g of a 25% tetramethylammonium hydride aqueous solution, 113.0 g of ultrapure water, and 1846 g of ethanol. The mixture was allowed to react at 60° C. for three hours. After the addition of 3920 g of propylene glycol monopropyl ether, the mixture was concentrated under reduced pressure until the total amount of the solution became 630 g. Then, 30 g of a 10% propylene glycol monopropyl ether solution of acetic acid was added so that the total solid content was 10% to obtain the film-forming composition solution (I) for forming the first silica-based film.

5.3 Synthesis Example 2

Preparation of Film-forming Composition Solution (II)

In a separable flask made of quartz, 136.23 g of methyltrimethoxysilane (66.75 g when converted into complete hydrolysis-condensation product), 166.66 g of tetraethoxysilane (48.33 g when converted into complete hydrolysis-condensation product), and 29.65 g of vinyltrimethoxysilane (15.71 g when converted into complete hydrolysis-condensation product) were added to a mixed solution of 15.84 g of a 40% methylamine aqueous solution, 725.72 g of ultrapure water, and 1541.7 g of ethanol. The mixture was allowed to react at 60° C. for two hours. The mixture was then cooled to room temperature. After the addition of 42.85 g of a 60% nitric acid aqueous solution, the mixture was stirred at room temperature for one hour. After the addition of 392.37 g of propylene glycol monopropyl ether to the solution, the mixture was concentrated under reduced pressure until the total amount of the solution was 1307.9 g. Then, 65.40 g of a 10% propylene glycol monopropyl ether solution of acetic acid was added so that the total solid content was 10% to obtain the film-forming composition solution (II) for forming the second silica-based film.

5.4 Synthesis Example 3

Preparation of Film-forming Composition Solution (III)

A 1,000 ml three-necked flask equipped with a thermometer, an argon gas feed pipe, and a stirrer was charged with 120 ml of tetrahydrofuran, 3.46 g of tetrakistriphenylphosphine palladium, 2.1 g of dichlorobistriphenylphosphine palladium, 1.44 g of copper iodide, 20 ml of piperidine, and 185.72 g of 4,4'-bis(2-iodophenoxy)benzophenone. After the addition of 65.48 g of 4,4'-diethynyl diphenyl ether, the mixture was allowed to react at 25° C. for 20 hours. The reaction solution was reprecipitated twice from 5 l of acetic acid. The resulting precipitate was dissolved in cyclohexanone, washed twice with ultrapure water, and reprecipitated from 5 l of methanol. The precipitate was filtered and dried to obtain a polymer with a weight average molecular weight of 35,000. 20 g of the polymer was dissolved in 180 g of cyclohexanone to obtain the film-forming composition solution (III) for forming the organic film.

5.5 Synthesis Example 4

Preparation of Film-forming Composition Solution (II)

In a separable flask made of quartz, 163.48 g of methyltrimethoxysilane (80.11 g when converted into complete hydrolysis-condensation product), 91.34 g of tetramethoxysilane (35.62 g when converted into complete hydrolysis-condensation product), and 29.24 g of ethynyltrimethoxysilane (15.50 g when converted into complete hydrolysis-condensation product) were dissolved in 590.17 g of propylene glycol monoethyl ether. The mixture was stirred using a three-one motor to stabilize the solution temperature at 50° C. Then, 178.40 g of ultrapure water, in which 0.64 g of maleic acid was dissolved, was added to the solution in one hour. The mixture was then allowed to react at 50° C. for one hour. After the addition of 393.69 g of propylene glycol monoethyl ether, the reaction solution was cooled to room temperature. The reaction solution was then concentrated under reduced pressure until the total amount of the solution was 1,312.3 g so that the total solid content was 10% to obtain the film-forming composition solution (II) for forming the second silica-based film.

5.6 Synthesis Example 5

Preparation of Film-forming Composition Solution (II)

In a separable flask made of quartz, 136.23 g of methyltrimethoxysilane (66.75 g when converted into complete hydrolysis-condensation product), 166.66 g of tetraethoxysilane (48.33 g when converted into complete hydrolysis-condensation product), and 25.65 g of dimethylethoxyethynylsilane (18.21 g when converted into complete hydrolysis-condensation product) were added to a mixed solution of 46.67 g of a 25% tetramethylammonium hydride aqueous solution, 656.97 g of ultrapure water, and 1633.62 g of ethanol. The mixture was allowed to react at 60° C. for two hours. The mixture was then cooled to room temperature. After the addition of 13.44 g of a 60% nitric acid aqueous solution, the mixture was stirred at room temperature for one hour. After the addition of 399.87 g of propylene glycol monopropyl ether, the mixture was concentrated under reduced pressure until the total amount of the solution was 1332.9 g. Then, 66.65 g of a 10% propylene glycol monopropyl ether solution of acetic acid was added so that the total solid content was 10% to obtain the film-forming composition solution (II) for forming the second silica-based film.

5.7 Synthesis Example 6

Preparation of Film-forming Composition Solution (II)

In a separable flask made of quartz, 163.48 g of methyltrimethoxysilane (80.11 g when converted into complete hydrolysis-condensation product), 145.83 g of tetraethoxysilane (42.29 g when converted into complete hydrolysis-condensation product), 35.06 g of bis(triethoxysilane)acetylene (12.97 g when converted into complete hydrolysis-condensation product), and 0.076 g of tetrakis(acetylacetonato)titanium were dissolved in 820.03 g of dipropylene glycol dimethyl ether. The mixture was stirred using a three-one motor to stabilize the solution temperature at 50° C. Then, 189.21 g of ion-exchanged water was added to the solution in one hour. The mixture was then allowed to react at 50° C. for three hours. After the addition of 406.11 g of distilled dipropylene glycol dimethyl ether, the reaction solution was cooled to room temperature. The reaction solution was then concentrated under reduced pressure until the total amount of the solution was 1,353.7 g so that the total solid content was 10% to obtain the film-forming composition solution (II) for forming the second silica-based film.

5.8 Experimental Example 1

The film-forming composition solution (I) obtained in Synthesis Example 1 was filtered through a filter made of Teflon (registered trademark) with a pore size of 0.2 μm, and applied to an 8-inch silicon wafer to a thickness of 5000 Å. The substrate was dried at 80° C. for one minute and at 200° C. for one minute to obtain a first coating. The film-forming composition solution (II) obtained in Synthesis Example 2 was filtered through a filter made of Teflon (registered trademark) with a pore size of 0.2 μm, and applied to the first coating to a thickness of 100 Å. The substrate was dried at 80° C. for one minute and at 200° C. for one minute to obtain a second coating. The film-forming composition solution (III) obtained in Synthesis Example 3 was filtered through a filter made of Teflon (registered trademark) with a pore size of 0.2 μm, and applied to the second coating to a thickness of 5000 Å. The substrate was dried at 80° C. for one minute and at 200° C. for one minute. The substrate was sintered on a hot plate at 400° C. for 30 minutes in a nitrogen atmosphere to prepare a laminate. In order to evaluate the adhesion of the laminate, the fracture toughness between the inorganic insulating film and the organic insulating film of the resulting laminate was measured by the four-point bending method. As a result, the fracture toughness was 10 J/m$^2$. The relative dielectric constant of the laminate was 2.8.

5.9 Experimental Example 2

A laminate was obtained in the same manner as in the Experimental Example 1 except for using the film-forming composition solution (II) obtained in Synthesis Example 4 instead of the film-forming composition solution (II) obtained in Synthesis Example 2. In order to evaluate the adhesion of the laminate, the fracture toughness between the inorganic insulating film and the organic insulating film of the resulting laminate was measured by the four-point bending method. As a result, the fracture toughness was 10 J/m$^2$. The relative dielectric constant of the laminate was 2.8.

5.10 Experimental Example 3

A laminate was obtained in the same manner as in the Experimental Example 1 except for using the film-forming composition solution (II) obtained in Synthesis Example 5 instead of the film-forming composition solution (II) obtained in Synthesis Example 2. In order to evaluate the adhesion of the laminate, the fracture toughness between the inorganic insulating film and the organic insulating film of the resulting laminate was measured by the four-point bending method. As a result, the fracture toughness was 10 J/m² The relative dielectric constant of the laminate was 2.8.

5.11 Experimental Example 4

A laminate was obtained in the same manner as in the Experimental Example 1 except for using the film-forming composition solution (II) obtained in Synthesis Example 6 instead of the film-forming composition solution (II) obtained in Synthesis Example 2. In order to evaluate the adhesion of the laminate, the fracture toughness between the inorganic insulating film and the organic insulating film of the resulting laminate was measured by the four-point bending method. As a result, the fracture toughness was 10 J/m². The relative dielectric constant of the laminate was 2.8.

5.12 Comparative Example

The film-forming composition solution (I) obtained in Synthesis Example 1 was filtered through a filter made of Teflon (registered trademark) with a pore size of 0.2 μm, and applied to an 8-inch silicon wafer to a thickness of 5000 Å. The substrate was dried at 80° C. for one minute and at 200° C. for one minute to obtain a first coating. The film-forming composition solution (III) obtained in Synthesis Example 3 was filtered through a filter made of Teflon (registered trademark) with a pore size of 0.2 μm, and applied to the first coating to a thickness of 5000 Å. The substrate was dried at 80° C. for one minute and at 200° C. for one minute. The substrate was sintered on a hot plate at 400° C. for 30 minutes in a nitrogen atmosphere.

The fracture toughness between the inorganic insulating film and the organic insulating film of the resulting laminate was measured by the four-point bending method. As a result, the fracture toughness was 4 J/m². The relative dielectric constant of the laminate was 2.7.

As is clear from Experimental Examples 1 to 4, it was found that the laminates of Experimental Examples 1 to 4 exhibit improved adhesion in comparison with the comparative example (without the second silica-based film). Therefore, the effect of the laminate of the invention was confirmed. According to the laminate of the invention and the method of manufacturing the same, an insulating film having a low dielectric constant and exhibiting improved adhesion can be provided.

Although only some embodiments of the invention have been described in detail above, those skilled in the art will readily appreciate that many modifications are possible in the embodiments without departing from the novel teachings and advantages of this invention. Accordingly, all such modifications are intended to be included within the scope of this invention.

What is claimed is:

1. A laminate, comprising:
   a first silica-based film;
   a second silica-based film on the first silica-based film; and
   an organic film on the second silica-based film; and
   wherein the second silica-based film includes an organic group containing a carbon-carbon double bond or a carbon-carbon triple bond; and
   wherein the second silica-based film is a film obtained by forming a coating by using a film-forming composition which includes a hydrolysis-condensation product obtained by hydrolysis and condensation of the following silane compound (A) and the following silane compound (B) in the presence of an acidic, basic, or metal chelate compound, and curing the resulting coating, wherein the concentration of the total amount of the compound (A) and the compound (B) at the time of hydrolysis and condensation is 0.1 to 30 wt %;
   (A) at least one silane compound selected from the group consisting of compounds shown by the following general formula (1), compounds shown by the following general formula (2), and compounds shown by the following general formula (3), $$R_a Si(OR^1)_{4-a} \quad (1)$$

wherein R represents a hydrogen atom, a fluorine atom, or an organic group, $R^1$ represents an organic group, and a represents an integer of 1 or 2, $$Si(OR^2)_4 \quad (2)$$

wherein $R^2$ represents an organic group, $$R^3_b(R^4O)_{3-b}Si\text{—}(R^7)_d\text{—}Si(OR^5)_{3-c}R^6_c \quad (3)$$

wherein $R^3$ to $R^6$ individually represent organic groups, b and c individually represent integers from 0 to 2, $R^7$ represents an oxygen atom, a phenylene group, or a group —$(CH_2)_m$—, wherein m represents an integer from 1 to 6, and d represents 0 or 1; and
   (B) at least one silane compound selected from the group consisting of compounds shown by the following general formula (4) and compounds shown by the following general formula (5),

wherein $R_x$ represents an organic group containing a carbon-carbon double bond or a carbon-carbon triple bond, and $R^{81}$ to $R^{83}$ individually represent a hydrogen atom, a halogen atom, a hydroxyl group, an alkoxyl group, or an organic group, provided that at least one of $R^{81}$ to $R^{83}$ represents an atom or a group other than the organic group,

wherein $R_y$ represents a divalent organic group containing a carbon-carbon double bond or a carbon-carbon triple bond, and $R^{91}$ to $R^{96}$ individually represent a hydrogen atom, a halogen atom, a hydroxyl group, an alkoxyl group, or an organic group, provided that at least one of $R^{91}$ to $R^{93}$ and at least one of $R^{94}$ to $R^{96}$ represent an atom or a group other than the organic group,
   wherein the organic film includes at least one compound selected from a polyarylene, polyarylene ether, polybenzoxazole, and polyimide.

2. The laminate as defined in claim 1, having a relative dielectric constant of 2.8 or less.

3. An insulating film, comprising the laminate as defined in claim 1.

4. A semiconductor device, comprising the insulating film as defined in claim 1.

5. The laminate as defined in claim 1, wherein the thickness of the first silica-based film is 30 to 500 nm, the thickness of the second silica-based film is 5 to 100 nm, and the thickness of the organic film is 30 to 500 nm.

6. The laminate as defined in claim 1,
wherein the first silica-based film is a film obtained by forming a coating by using a film-forming composition which includes a hydrolysis-condensation product obtained by hydrolysis and condensation of at least one silane compound selected from the group consisting of compounds shown by the following general formula (1), compounds shown by the following general formula (2), and compounds shown by the following general formula (3), and curing the resulting coating;

$$R_a Si(OR^1)_{4-a} \quad (1)$$

wherein R represents a hydrogen atom, a fluorine atom, or an organic group, $R^1$ represents an organic group, and a represents 1 or 2, $$Si(OR^2)_4 \quad (2)$$

wherein $R^2$ represents an organic group, $$R^3{}_b(R^4O)_{3-b}Si-(R^7)_d-Si(OR^5)_{3-c}R^6{}_c \quad (3)$$

wherein $R^3$ to $R^6$ individually represent organic groups, b and c individually represent integers from 0 to 2, $R^7$ represents an oxygen atom, a phenylene group, or a group $-(CH_2)_m-$ (wherein m represents an integer from 1 to 6), and d represents 0 or 1.

7. A laminate, comprising:
a first silica-based film;
a second silica-based film on the first silica-based film; and
an organic film on the second silica-based film; and
wherein the second silica-based film includes an organic group containing a carbon-carbon double bond or a carbon-carbon triple bond; and
wherein the second silica-based film is a film obtained by forming a coating by using a film-forming composition which includes a hydrolysis-condensation product obtained by hydrolysis and condensation of the following silane compound (A) and the following silane compound (B) in the presence of an acidic, basic, or metal chelate compound, and curing the resulting coating, wherein the concentration of the total amount of the compound (A) and the compound (B) at the time of hydrolysis and condensation is 0.1 to 30 wt %;
(A) at least one silane compound selected from the group consisting of compounds shown by the following general formula (1), compounds shown by the following general formula (2), and compounds shown by the following general formula (3), $$R_a Si(OR^1)_{4-a} \quad (1)$$

wherein R represents a hydrogen atom, a fluorine atom, or an organic group, $R^1$ represents an organic group, and a represents an integer of 1 or 2, $$Si(OR^2)_4 \quad (2)$$

wherein $R^2$ represents an organic group, $$R^3{}_b(R^4O)_{3-b}Si-(R^7)_d-Si(OR^5)_{3-c}R^6{}_c \quad (3)$$

wherein $R^3$ to $R^6$ individually represent organic groups, b and c individually represent integers from 0 to 2, $R^7$ represents an oxygen atom, a phenylene group, or a group $-(CH_2)_m-$, wherein m represents an integer from 1 to 6, and d represents 0 or 1; and
(B) at least one silane compound selected from the group consisting of compounds shown by the following general formula (4) and compounds shown by the following general formula (5),

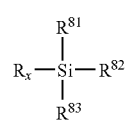

(4)

wherein $R_x$ represents an organic group containing a carbon-carbon double bond or a carbon-carbon triple bond, and $R^{81}$ to $R^{83}$ individually represent a hydrogen atom, a halogen atom, a hydroxyl group, an alkoxyl group, or an organic group, provided that at least one of $R^{81}$ to $R^{83}$ represents an atom or a group other than the organic group,

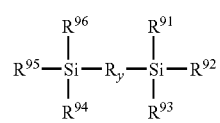

(5)

wherein $R_y$ represents a divalent organic group containing a carbon-carbon double bond or a carbon-carbon triple bond, and $R^{91}$ to $R^{96}$ individually represent a hydrogen atom, a halogen atom, a hydroxyl group, an alkoxyl group, or an organic group, provided that at least one of $R^{91}$ to $R^{93}$ and at least one of $R^{94}$ to $R^{96}$ represent an atom or a group other than the organic group, and
wherein the organic film includes at least one polymer selected from the group consisting of polymers shown by the following general formulas (6) to (9);

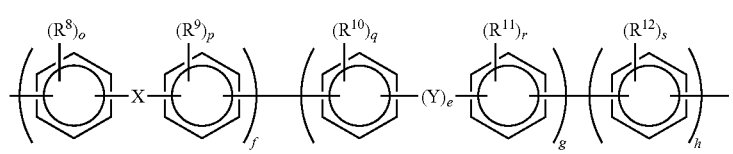

(6)

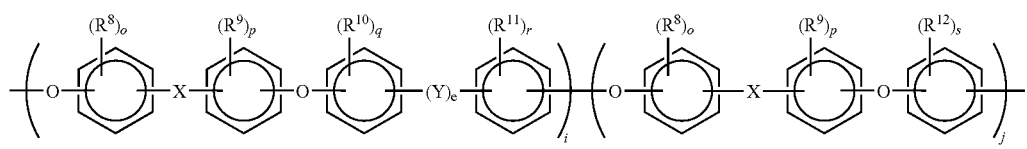

(7)

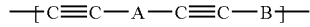
(8)

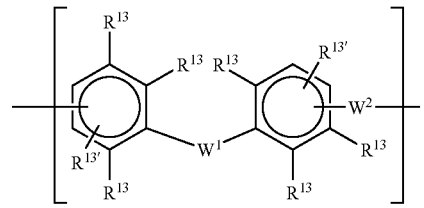
(9)

wherein $R^8$ to $R^{12}$ individually represent a hydrocarbon group having 1 to 20 carbon atoms, a cyano group, a nitro group, an alkoxyl group having 1 to 20 carbon atoms, or a halogen atom, X represents at least one group selected from the group consisting of a group shown by —CQQ'—, wherein Q and Q' individually represent an alkyl halide group, an alkyl group, a hydrogen atom, a halogen atom, or an aryl group, and a fluorenylene group, Y represents at least one group selected from the group consisting of —O—, —CO—, —COO—, —CONH—, —S—, —SO$_2$—, and a phenylene group, e represents 0 or 1, o, p q, r and s individually represent integers from 0 to 4, f is 5 to 100 mol %, g is 0 to 95 mol %, h is 0 to 95 mol %, provided that f+g+h=100 mol %, i is 0 to 100 mol %, and j is 0 to 100 mol %, provided that i+j=100 mol %; A and B individually represent at least one group selected from the group consisting of divalent aromatic groups shown by the following general formulas (10) to (12); $R^{13}$ and $R^{13'}$ individually represent a hydrogen atom or at least one group selected from the group consisting of aromatic groups shown by the following general formulas (13) and (14); and $W^1$ and $W^2$ represent at least one group selected from the group consisting of divalent aromatic group shown by the following general formulas (15) and (16),

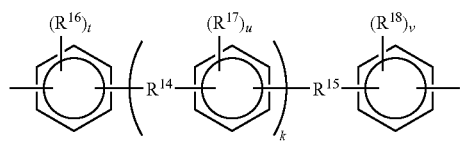
(10)

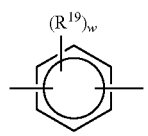
(11)

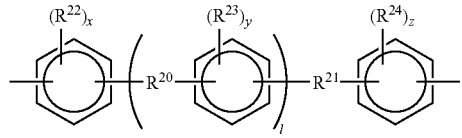
(12)

wherein $R^{14}$, $R^{15}$, $R^{20}$, and $R^{21}$ individually represent a single bond, —O—, —CO—, —CH$_2$—, —COO—, —CONH—, —S—, —SO$_2$—, phenylene group, isopropylidene group, hexafluoroisopropylidene group, diphenylmethylidene group, fluorenylene group, or group shown by the following formula,

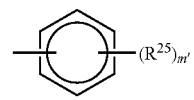

$R^{16}$ to $R^{19}$ and $R^{22}$ to $R^{24}$ individually represent a hydrocarbon group having 1 to 20 carbon atoms, a cyano group, a nitro group, an alkoxyl group having 1 to 20 carbon atoms, or an aryl group, k represents an integer from 0 to 3, l represents an integer from 2 to 3, and t to z individually represent integers from 0 to 4,

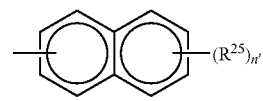
(13)

(14)

wherein $R^{25}$ represents a halogen atom, a hydrocarbon group having 1 to 20 carbon atoms, an alkyl halide group, an alkoxyl groups having 1 to 20 carbon atoms, a phenoxy group, or an aryl group, m' represents an integer from 0 to 5, and n' represents an integer from 0 to 7,

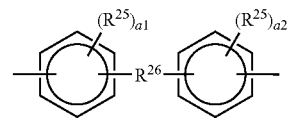
(15)

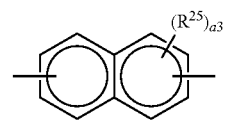
(16)

wherein $R^{25}$ represents a halogen atom, a hydrocarbon group having 1 to 20 carbon atoms, an alkyl halide group, an alkoxyl group having 1 to 20 carbon atoms, a phenoxy group, or an aryl group, $R^{26}$ represents a single bond, —O—, —CO—, —CH$_2$—, —COO—, —CONH—, —S—, —SO$_2$—, phenylene group, isopropylidene group, hexafluoroisopropylidene group, diphenylmethylidene group, methylphenylmethylidene group, trifluoromethylmethylmethylidene group, trifluoromethylphenylmethylidene group, fluorenylene group, or group shown by the following formula,

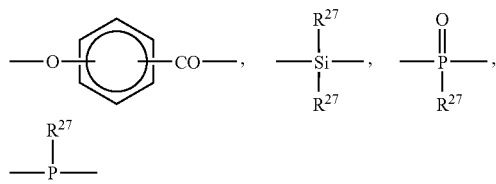

wherein $R^{27}$ individually represents a hydrogen atom, a hydrocarbon group having 1 to 4 carbon atoms, or a phenyl group), a1 and a2 individually represent integers from 0 to 4, and a3 represents an integer from 0 to 6.

8. The laminate as defined in claim 7, having a relative dielectric constant of 2.8 or less.

9. An insulating film, comprising the laminate as defined in claim 7.

10. The laminate as defined in claim 7, wherein the thickness of the first silica-based film is 30 to 500 nm, the thickness of the second silica-based film is 5 to 100 nm, and the thickness of the organic film is 30 to 500 nm.

11. The laminate as defined in claim 7, wherein the first silica-based film is a film obtained by forming a coating by using a film-forming composition which includes a hydrolysis-condensation product obtained by hydrolysis and condensation of at least one silane compound selected from the group consisting of compounds shown by the following general formula (1), compounds shown by the following general formula (2), and compounds shown by the following general formula (3), and curing the resulting coating;

$$R_a Si(OR^1)_{4-a} \qquad (1)$$

wherein R represents a hydrogen atom, a fluorine atom, or an organic group, $R^1$ represents an organic group, and a represents 1 or 2, $$Si(OR^2)_4 \qquad (2)$$

wherein $R^2$ represents an organic group, $$R^3{}_b(R^4O)_{3-b}Si-(R^7)_d-Si(OR^5)_{3-c}R^6{}_c \qquad (3)$$

wherein $R^3$ to $R^6$ individually represent organic groups, b and c individually represent integers from 0 to 2, $R^7$ represents an oxygen atom, a phenylene group, or a group $-(CH_2)_m-$, wherein m represents an integer from 1 to 6, and d represents 0 or 1.

12. A method of forming a laminate comprising a first silica-based film, a second silica-based film on the first silica-based film, and an organic film on the second silica-based film, the method comprising:
 forming a first coating for a first silica-based film on a substrate;
 forming a second coating for a second silica-based film on the first coating, the second coating including an organic group containing a carbon-carbon double bond or a carbon-carbon triple bond;
 forming a third coating for an organic film on the second coating; and
 curing a multilayer film including the first to third coatings to form the first silica-based film, the second silica-based film, and the organic film;
 wherein the second coating is formed by using a film-forming composition which includes a hydrolysis-condensation product obtained by hydrolysis and condensation of the following silane compound (A) and the following silane compound (B) in the presence of an acidic, basic, or metal chelate compound, and curing the resulting coating, wherein the concentration of the total amount of the compound (A) and the compound (B) at the time of hydrolysis and condensation is 0.1 to 30 wt %;

(A) at least one silane compound selected from the group consisting of compounds shown by the following general formula (1), compounds shown by the following general formula (2), and compounds shown by the following general formula (3), $$R_a Si(OR^1)_{4-a} \qquad (1)$$

wherein R represents a hydrogen atom, a fluorine atom, or an organic group, $R^1$ represents an organic group, and a represents an integer of 1 or 2, $$Si(OR^2)_4 \qquad (2)$$

wherein $R^2$ represents an organic group, $$R^3{}_b(R^4O)_{3-b}Si-(R^7)_d-Si(OR^5)_{3-c}R^6{}_c \qquad (3)$$

wherein $R^3$ to $R^6$ individually represent organic groups, b and c individually represent integers from 0 to 2, $R^7$ represents an oxygen atom, a phenylene group, or a group $-(CH_2)_m-$ (wherein m represents an integer from 1 to 6), and d represents 0 or 1; and (B) at least one silane compound selected from the group consisting of compounds shown by the following general formula (4) and compounds shown by the following general formula (5),

wherein $R_x$ represents an organic group containing a carbon-carbon double bond or a carbon-carbon triple bond, and $R^{81}$ to $R^{83}$ individually represent a hydrogen atom, a halogen atom, a hydroxyl group, an alkoxyl group, or an organic group, provided that at least one of $R^{81}$ to $R^{83}$ represents an atom or a group other than the organic group,

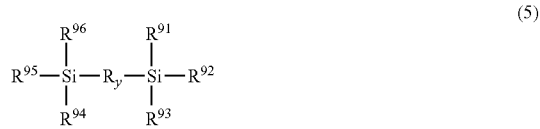

wherein $R_y$ represents a divalent organic group containing a carbon-carbon double bond or a carbon-carbon triple bond, and $R^{91}$ to $R^{96}$ individually represent a hydrogen atom, a halogen atom, a hydroxyl group, an alkoxyl group, or an organic group, provided that at least one of $R^{91}$ to $R^{93}$ and at least one of $R^{94}$ to $R^{96}$ represent an atom or a group other than the organic group, and wherein the organic film includes at least one compound selected from a polyarylene, polyarylene ether, polybenzoxazole, and polyimide.

13. A method of forming a laminate comprising a first silica-based film, a second silica-based film on the first silica-based film, and an organic film on the second silica-based film, the method comprising:

forming a first coating for a first silica-based film on a substrate;

forming a second coating for a second silica-based film on the first coating, the second coating including an organic group containing a carbon-carbon double bond or a carbon-carbon triple bond;

forming a third coating for an organic film on the second coating; and curing a multilayer film including the first to third coatings to form the first silica-based film, the second silica-based film, and the organic film;

wherein the second coating is formed by using a film-forming composition which includes a hydrolysis-condensation product obtained by hydrolysis and condensation of the following silane compound (A) and the following silane compound (B) in the presence of an acidic, basic, or metal chelate compound, and curing the resulting coating, wherein the concentration of the total amount of the compound (A) and the compound (B) at the time of hydrolysis and condensation is 0.1 to 30 wt %;

(A) at least one silane compound selected from the group consisting of compounds shown by the following general formula (1), compounds shown by the following general formula (2), and compounds shown by the following general formula (3), $$R_a Si(OR^1)_{4-a} \quad (1)$$

wherein R represents a hydrogen atom, a fluorine atom, or an organic group, $R^1$ represents an organic group, and a represents an integer of 1 or 2, $$Si(OR^2)_4 \quad (2)$$

wherein $R^2$ represents an organic group,

wherein $R^3$ to $R^6$ individually represent organic groups, b and c individually represent integers from 0 to 2, $R^7$ represents an oxygen atom, a phenylene group, or a group $-(CH_2)_m-$, wherein m represents an integer from 1 to 6, and d represents 0 or 1; and (B) at least one silane compound selected from the group consisting of compounds shown by the following general formula (4) and compounds shown by the following general formula (5),

wherein $R_x$ represents an organic group containing a carbon-carbon double bond or a carbon-carbon triple bond, and $R^{81}$ to $R^{83}$ individually represent a hydrogen atom, a halogen atom, a hydroxyl group, an alkoxyl group, or an organic group, provided that at least one of $R^{81}$ to $R^{83}$ represents an atom or a group other than the organic group,

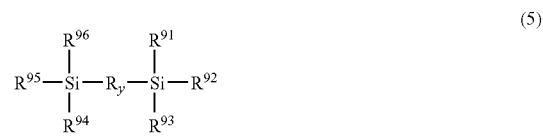

wherein $R^y$ represents a divalent organic group containing a carbon-carbon double bond or a carbon-carbon triple bond, and $R^{91}$ to $R^{96}$ individually represent a hydrogen atom, a halogen atom, a hydroxyl group, an alkoxyl group, or an organic group, provided that at least one of $R^{91}$ to $R^{93}$ and at least one of $R^{94}$ to $R^{96}$ represent an atom or a group other than the organic group, and wherein the organic film includes at least one polymer selected from the group consisting of polymers shown by the following general formulas (6) to (9);

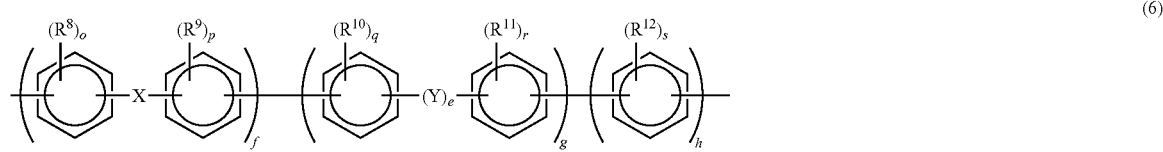

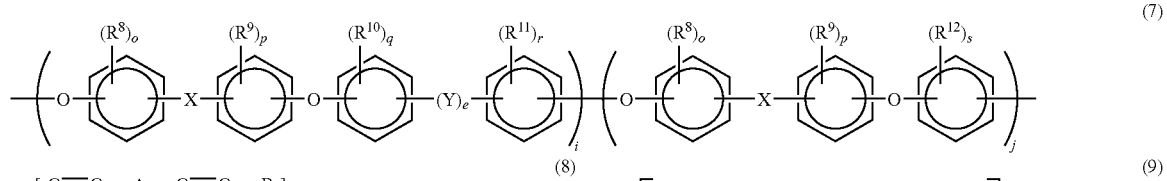

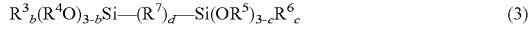

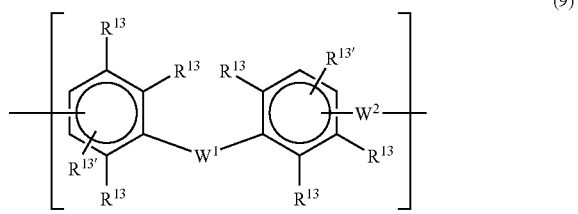

wherein $R^8$ to $R^{12}$ individually represent a hydrocarbon group having 1 to 20 carbon atoms, a cyano group, a nitro group, an alkoxyl group having 1 to 20 carbon atoms, or a halogen atom, X represents at least one group selected from the group consisting of a group shown by —CQQ'— (wherein Q and Q' individually represent an alkyl halide group, an alkyl group, a hydrogen atom, a halogen atom, or an aryl group) and a fluorenylene group, Y represents at least one group selected from the group consisting of —O—, —CO—, —COO—, —CONH—, —S—, —SO$_2$—, and a phenylene group, e represents 0 or 1, o, p q, r and s individually represent integers from 0 to 4, f is 5 to 100 mol %, g is 0 to 95 mol %, h is 0 to 95 mol %, provided that f+g+h=100 mol %, i is 0 to 100 mol %, and j is 0 to 100 mol %, provided that i+j=100 mol %; A and B individually represent at least one group selected from the group

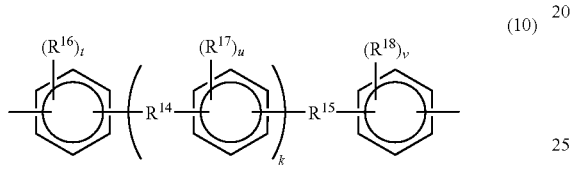

(10)

consisting of divalent aromatic groups shown by the following general formulas (10) to (12); $R^{13}$ and $R^{13'}$ individually represent a hydrogen atom or at least one group selected from the group consisting of aromatic groups shown by the following general formulas (13) and (14); and $W^1$ and $W^2$ represent at least one group selected from the group consisting of divalent aromatic group shown by the following general formulas (15) and (16),

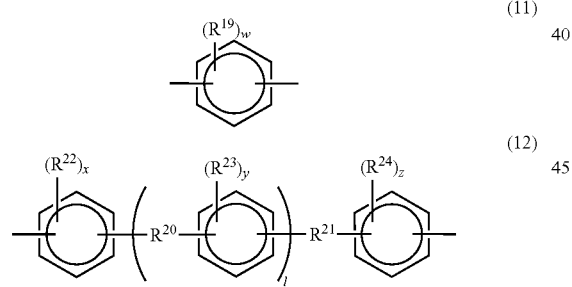

(11)

(12)

wherein $R^{14}$, $R^{15}$, $R^{20}$, and $R^{21}$ individually represent a single bond, —O—, —CO—, —CH$_2$—, —COO—, —CONH—, —S—, —SO$_2$—, phenylene group, isopropylidene group, hexafluoroisopropylidene group, diphenylmethylidene group, fluorenylene group, or group shown by the following formula,

$R^{16}$ to $R^{19}$ and $R^{22}$ to $R^{24}$ individually represent a hydrocarbon group having 1 to 20 carbon atoms, a cyano group, a nitro group, an alkoxyl group having 1 to 20 carbon atoms, or an aryl group, k represents an integer from 0 to 3, l represents an integer from 2 to 3, and t to z individually represent integers from 0 to 4,

(13)

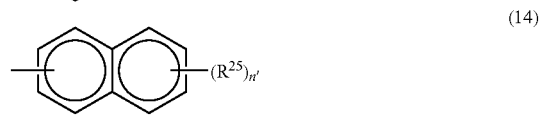

(14)

wherein $R^{25}$ represents a halogen atom, a hydrocarbon group having 1 to 20 carbon atoms, an alkyl halide group, an alkoxyl groups having 1 to 20 carbon atoms, a phenoxy group, or an aryl group, m' represents an integer from 0 to 5, and n' represents an integer from 0 to 7,

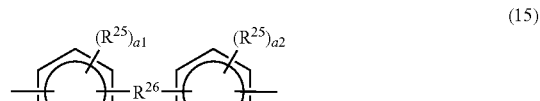

(15)

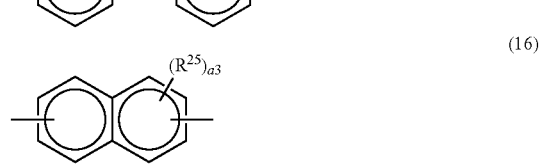

(16)

wherein $R^{25}$ represents a halogen atom, a hydrocarbon group having 1 to 20 carbon atoms, an alkyl halide group, an alkoxyl group having 1 to 20 carbon atoms, a phenoxy group, or an aryl group, $R^{26}$ represents a single bond, —O—, —CO—, —CH$_2$—, —COO—, —CONH—, —S—, —SO$_2$—, phenylene group, isopropylidene group, hexafluoroisopropylidene group, diphenylmethylidene group, methylphenylmethylidene group, trifluoromethylmethylmethylidene group, trifluoromethylphenylmethylidene group,

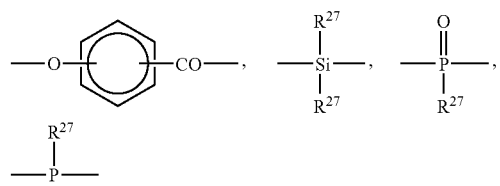

fluorenylene group, or group shown by the following formula,
wherein $R^{27}$ individually represents a hydrogen atom, a hydrocarbon group having 1 to 4 carbon atoms, or a phenyl group, a1 and a2 individually represent integers from 0 to 4, and a3 represents an integer from 0 to 6.

* * * * *